(12) United States Patent
Kim et al.

(10) Patent No.: US 12,073,917 B2
(45) Date of Patent: Aug. 27, 2024

(54) MEMORY DEVICE THAT INCLUDES A DUTY CORRECTION CIRCUIT, MEMORY CONTROLLER THAT INCLUDES A DUTY SENSING CIRCUIT, AND STORAGE DEVICE THAT INCLUDES A MEMORY DEVICE

(71) Applicant: SAMSUNG ELECTRONICS CO., LTD., Suwon-si (KR)

(72) Inventors: Tongsung Kim, Suwon-si (KR); Youngmin Jo, Hwaseong-si (KR); Manjae Yang, Hwaseong-si (KR); Chiweon Yoon, Seoul (KR); Junha Lee, Seoul (KR); Byunghoon Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 343 days.

(21) Appl. No.: 17/404,510

(22) Filed: Aug. 17, 2021

(65) Prior Publication Data

US 2022/0230666 A1 Jul. 21, 2022

(30) Foreign Application Priority Data

Jan. 21, 2021 (KR) .................. 10-2021-0008911

(51) Int. Cl.
*G06F 1/04* (2006.01)
*G06F 3/06* (2006.01)
*G11C 7/22* (2006.01)
*G11C 29/02* (2006.01)
*G11C 5/14* (2006.01)

(52) U.S. Cl.
CPC ............ *G11C 7/222* (2013.01); *G06F 1/04* (2013.01); *G06F 3/0604* (2013.01); *G06F 3/0659* (2013.01); *G06F 3/0673* (2013.01); *G11C 29/023* (2013.01); *G11C 29/028* (2013.01); *G11C 5/145* (2013.01)

(58) Field of Classification Search
None
See application file for complete search history.

(56) References Cited

U.S. PATENT DOCUMENTS

| 4,380,015 | A | * | 4/1983 | Ito .................. | G11B 27/36 347/250 |
| 5,670,903 | A | * | 9/1997 | Mizuno ............ | G06F 1/10 327/158 |
| 9,503,061 | B2 | | 11/2016 | Hsu et al. | |

(Continued)

*Primary Examiner* — Paul Yen
(74) *Attorney, Agent, or Firm* — F. CHAU & ASSOCIATES, LLC

(57) ABSTRACT

A storage device includes a plurality of memory chips and a chip. The plurality of memory chips includes a first memory chip configured to generate a first signal based on a first clock signal, and a second memory chip configured to generate a second signal based on a second clock signal. The chip is configured to receive the first and second signals and generate and output a first and second comparison signal based on a duty cycle of the first and second signals. The first memory chip is further configured to generate a first corrected signal by adjusting a duty cycle of the first clock signal based on the first comparison signal, and the second memory chip is further configured to generate a second corrected signal by adjusting a duty cycle of the second clock signal based on the second comparison signal.

19 Claims, 15 Drawing Sheets

(56) References Cited

U.S. PATENT DOCUMENTS

| | | |
|---|---|---|
| 10,437,472 B2 | 10/2019 | Bhuiyan et al. |
| 10,482,935 B2 | 11/2019 | Park et al. |
| 10,511,312 B1 | 12/2019 | Pastorello et al. |
| 2005/0238128 A1* | 10/2005 | Kim .................. H03L 7/0814 375/376 |
| 2016/0118960 A1* | 4/2016 | Hsu .................. G01R 31/3191 327/109 |
| 2018/0350414 A1* | 12/2018 | Park .................. G11C 16/32 |
| 2019/0196532 A1* | 6/2019 | Jang .................. H04L 7/0008 |
| 2019/0237127 A1 | 8/2019 | Moon et al. |
| 2019/0371376 A1 | 12/2019 | Kim |
| 2020/0185044 A1 | 6/2020 | Takada et al. |

\* cited by examiner

MEMORY DEVICE THAT INCLUDES A DUTY CORRECTION CIRCUIT, MEMORY CONTROLLER THAT INCLUDES A DUTY SENSING CIRCUIT, AND STORAGE DEVICE THAT INCLUDES A MEMORY DEVICE

CROSS-REFERENCE TO RELATED APPLICATIONS

This application claims priority under 35 U.S.C. § 119 to Korean Patent Application No. 10-2021-0008911, filed on Jan. 21, 2021, in the Korean Intellectual Property Office, the disclosure of which is incorporated by reference herein in its entirety.

TECHNICAL FIELD

Embodiments of the inventive concept relate to a memory device, a memory controller, and a storage device, and more particularly, to a memory device that includes a duty correction circuit, a memory controller that includes a duty sensing circuit, and a storage device that includes a memory device.

DISCUSSION OF RELATED ART

Non-volatile memory (NVM) is a type of memory that may retain stored information even without power. An electronic device may include a non-volatile memory device and a controller that may control the non-volatile memory. A non-volatile memory device may communicate with a controller at a relatively low frequency compared to a high-speed memory device such as a dynamic random access memory (DRAM) device or a static random access memory (SRAM) device.

SUMMARY

Embodiments of the inventive concept provide a memory device, a memory controller, and a storage device that may reduce a duty correction circuit (DCC) training time and reduce duty cycle degradation due to memory chip variation and channel variation.

According to an embodiment of the inventive concept, a storage device includes a plurality of memory chips and a chip. The plurality of memory chips includes a first memory chip configured to generate a first signal based on a first clock signal and output the first signal, and a second memory chip configured to generate a second signal based on a second clock signal and output the second signal. The chip is configured to receive the first signal and generate and output a first comparison signal based on a duty cycle of the first signal and receive the second signal and generate and output a second comparison signal based on a duty cycle of the second signal. The first memory chip is further configured to receive the first comparison signal and generate a first corrected signal by adjusting a duty cycle of the first clock signal based on the first comparison signal, and the second memory chip is further configured to receive the second comparison signal and generate a second corrected signal by adjusting a duty cycle of the second clock signal based on the second comparison signal.

According to an embodiment of the inventive concept, a memory device includes a clock pin, a plurality of memory chips, and a plurality of input/output pins commonly connected to the plurality of memory chips. The clock pin is configured to receive a clock signal from outside the memory device. The plurality of memory chips is configured to perform duty correction operations on a plurality of internal clock signals generated based on the clock signal. The plurality of memory chips is further configured to perform the duty correction operations in parallel and during a training period. The plurality of input/output pins commonly includes a first pin, a second pin, a third pin, and a fourth pin. The plurality of memory chips includes a first memory chip and a second memory chip. The first memory chip is configured to generate a first signal by adjusting a duty cycle of a first internal clock signal of the plurality of internal clock signals based on a first comparison signal received from the second pin and output the first signal through the first pin. The second memory chip is configured to generate a second signal by adjusting a duty cycle of a second internal clock signal of the plurality of internal clock signals based on a second comparison signal received from the fourth pin and output the second signal through the third pin.

According to an embodiment of the inventive concept, a memory controller includes a clock pin configured to output a clock signal, a plurality of input/output pins commonly connected to a plurality of memory chips that includes a first memory chip and a second memory chip, and a plurality of duty sensing circuits. The plurality of input/output pins includes a first pin, a second pin, a third pin, and a fourth pin. Each duty sensing circuit of the plurality of duty sensing circuits respectively corresponds to a memory chip of the plurality of memory chips. The plurality of duty sensing circuits includes a first duty sensing circuit and a second duty sensing circuit. The first duty sensing circuit is configured to receive a first signal from the first memory chip through the first pin and provide a first comparison signal based on a duty cycle of the first signal to the first memory chip through the second pin. The second duty sensing circuit is configured to receive a second signal from the second memory chip through the third pin and provide a second comparison signal according to a duty cycle of the second signal to the second memory chip through the fourth pin.

BRIEF DESCRIPTION OF THE DRAWINGS

The above and other features of the inventive concept will become more apparent by describing in detail embodiments thereof with reference to the accompanying drawings, in which.

DETAILED DESCRIPTION

Figure 1:
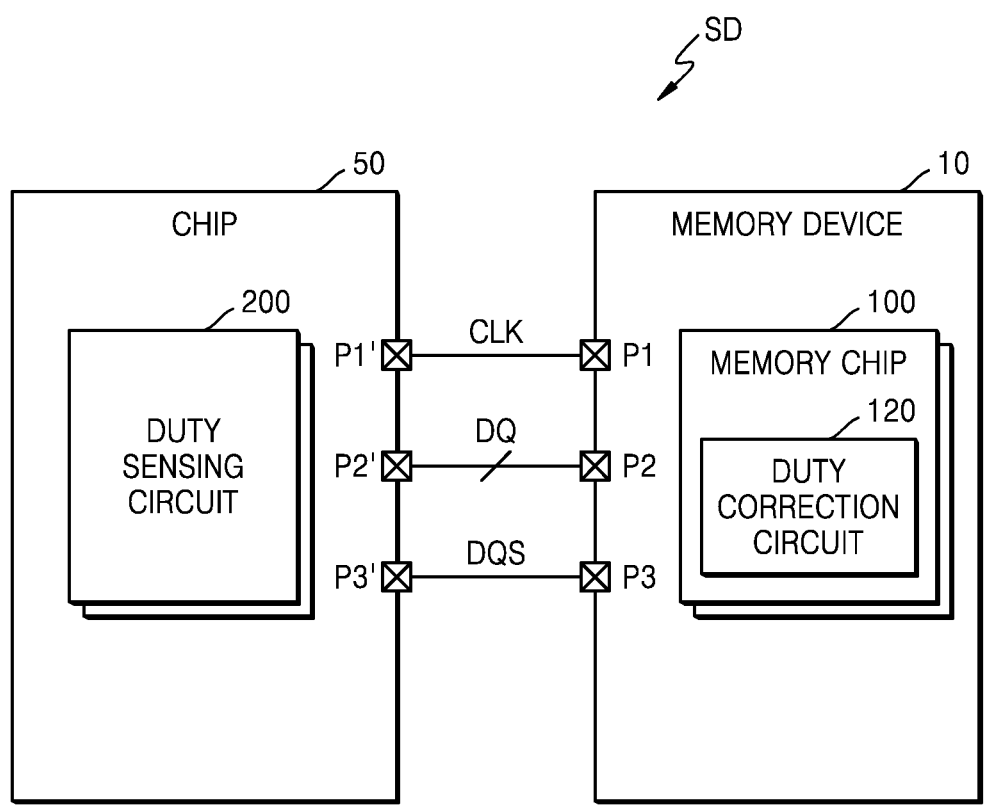
FIG. 1 is a schematic block diagram of a storage device according to an embodiment of the inventive concept.

Embodiments of the inventive concept will be described more fully hereinafter with reference to the accompanying drawings. Like reference numerals may refer to like elements throughout the accompanying drawings.

As used herein, the singular forms "a", "an", and "the" are intended to include the plural forms as well, unless the context clearly indicates otherwise.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the embodiments.

FIG. 1 is a schematic block diagram of a storage device SD according to an embodiment of the inventive concept.

Referring to FIG. 1, the storage device SD may include a memory device 10 and a chip 50. The memory device 10 may be a non-volatile memory device that includes a plurality of memory chips 100. Each of the memory chips 100 may include a duty correction circuit (DCC) of a plurality of DCCs 120, and the chip 50 may include a plurality of duty sensing circuits 200, respectively corresponding to the memory chips 100. In an embodiment, the chip 50 may correspond to a memory controller chip or a controller chip. In an embodiment, the chip 50 may correspond to a buffer chip between the memory device 10 and a memory controller. In an embodiment, the chip 50 may correspond to a separate sensing chip.

As the memory device 10 includes the plurality of memory chips 100, the memory device 10 may be referred to as a "multi-chip memory". For example, each memory chip of the plurality of memory chips 100 may include a dual die package (DDP), a quadruple die package (QDP), or an octuple die package (ODP). However, the plurality of memory chips 100 may alternatively or additionally correspond to a plurality of memory dies, and the memory device 10 may accordingly be referred to as a "multi-die package".

In an embodiment, each memory chip of the plurality of memory chips 100 may include a non-volatile memory chip. For example, each memory chip of the plurality of memory chips 100 may include a NAND flash memory chip. For example, the plurality of memory chips 100 may include a vertical NAND (VNAND) flash memory chip. The VNAND flash memory chip may include a plurality of word lines vertically stacked on a substrate and a plurality of cell strings that respectively include a plurality of memory cells that are respectively connected to the word lines. However, the plurality of memory chips 100 may alternatively or additionally include resistive memory chips such as a resistive RAM (ReRAM) chip, a phase change RAM (PRAM) chip, or a magnetic RAM (MRAM) chip.

The memory device 10 and the chip 50 may communicate through a plurality of signal lines that include a clock signal line, a plurality of input/output signal lines, and a data strobe signal line. For example, the memory device 10 and the chip 50 may implement and/or follow a standard protocol such as Toggle or ONFI. The chip 50 may transmit a clock signal CLK to the memory device 10 through the clock signal line. In an embodiment, the clock signal CLK may toggle at a certain frequency in a specific interval, and accordingly, the storage device SD may be an asynchronous system.

For example, the clock signal CLK may toggle at a frequency corresponding to a data input/output speed. The chip 50 may transmit a command and an address to the memory device 10 through the input/output signal lines and data DQ between the chip 50 and the memory device 10 through input/output signal lines. Furthermore, a data strobe signal DQS may be transmitted between the chip 50 and the memory device 10 through the data strobe signal line. Signal lines through which the clock signal CLK, the data DQ, and the data strobe signal DQS are transmitted or received may form a channel.

The memory device 10 may include a clock pin P1 connected to the clock signal line, a plurality of input/output pins P2 respectively connected to the plurality of input/output signal lines, and a data strobe pin P3 connected to the data strobe signal line. The plurality of memory chips 100 may be commonly connected to each of the clock pin P1, the plurality of input/output pins P2, and the data strobe pin P3. The chip 50 may include a clock pin P1', a plurality of input/output pins P2', and a data strobe pin P3', respectively connected to the clock signal line and the clock pin P1, the plurality of input/output signal lines and plurality of the input/output pins P2, and data strobe signal line and the data strobe pin P3. For example, the plurality of input/output pins P2 may include eight input/output pins, but the disclosure is not necessarily limited thereto.

During a read operation of the memory device 10, the memory device 10 may receive the clock signal CLK (e.g., a read enable signal nRE) from the chip 50 and may generate and output the data strobe signal DQS and the data DQ in response. In a double data rate (DDR) mode, the output of the data DQ may be synchronized with a rising edge and a falling edge of the data strobe signal DQS, and the memory device 10 may therefore sequentially output the data DQ. Thus, data windows of first and second data that are sequentially output may correspond to a logic high period and a logic low period of the data strobe signal DQS. As the data strobe signal DQS may be generated based on the clock signal CLK, the data windows of the first and second data may be determined based on a ratio of the logic high period and the logic low period of the clock signal CLK.

In a comparative example, a "duty mismatch" may be present in a clock signal when a logic high period and a logic low period of the clock signal are different from each other. In other words, a ratio between the logic high period and the logic low period (i.e., a duty ratio) that is not 1:1 may indicate a duty mismatch. When a clock signal includes a duty mismatch, first and second data of data that correspond to the clock signal may include data windows that are different from each other, and an effective data window of the first and second data may decrease. As a result, a memory device's read operation performance may degrade. Accordingly, there is an opportunity to remove a duty mismatch of a clock signal and secure an effective data window by performing a duty correction operation to the clock signal.

In contrast to the comparative example, in an embodiment, each memory chip of the plurality of memory chips 100 may include a DCC of the plurality of DCCs 120, and the chip 50 may include the plurality of duty sensing circuits 200 respectively corresponding to the memory chips 100. Each duty sensing circuit of the plurality of duty sensing circuits 200 may generate a comparison signal based on a duty cycle of a signal received from a corresponding memory chip of the plurality of memory chips 100, and the DCC 120 of each memory chip of the plurality of memory chips 100 may correct a duty cycle of an internal clock signal based on the comparison signal. As such, the DCC 120 of each memory chip of the plurality of memory chips 100 and each corresponding duty sensing circuit of the plurality of duty sensing circuits 200 may form a duty correction loop (i.e., a DCC loop).

In a comparative example, a memory device implemented as an asynchronous system it may not have a frequency that always toggles, and so data correction circuits of the memory device may perform duty correction operations only in a period in which a clock signal is applied. For example, the memory device may perform a duty correction operation by using a read enable signal as a clock signal. When a duty correction operation is performed in a read-out period (in which read data is output) during a read period of a read operation of the memory device 10, a clock duty may be changed for each clock cycle by the duty correction operation, and thus an effective data window of read data may decrease.

In contrast to the comparative example, in an embodiment, the plurality of DCCs 120 may perform a duty correction operation in a dedicated period rather than a read-out period. Hereinafter, this dedicated period may be referred to as a "DCC training period", and an operation performed by the plurality of DCCs 120 during the DCC training period may be referred to as "DCC training". In an embodiment, the DCC training period may include a predetermined number of clock cycles. During the DCC training period, the clock signal CLK (e.g., the read enable signal nRE) may toggle at a preset frequency.

In an embodiment, the DCC training may be performed in a read latency period before a read-out period of a read period. In an embodiment, the DCC training may be performed in a power-up period in which power is applied to the storage device SD. When the DCCs of the plurality of DCCs 120 sequentially perform the DCC training, the DCC training period becomes considerably longer. When the number of memory chips of the plurality of memory chips 100 included in the memory device 10 is m, and the DCC training period for each memory chip of the plurality of memory chips 100 is A, the total DCC training period of the memory device 10 corresponds to m×A (i.e., the product of m and A).

In a comparative example, as the number of memory chips of included in a memory device increases, a total DCC training period may become longer, and thus the performance of the memory device may degrade. However, in contrast to the comparative example, in an embodiment, even when the number of memory chips of the plurality of memory chips 100 included in the memory device 10 increases, the plurality of DCCs 120 may maintain a constant total DCC training period by performing the DCC training in parallel, and accordingly, performance degradation of the memory device 10 may be mitigated.

In a comparative example, each memory chip of a memory device may further include an output driver or a transmitting driver, and a duty corrected signal in a DCC of each of the memory chips may be output through the output driver. In this state, a mismatch of resistances of output drivers may be generated due to a variation of the memory chips (for example, a memory chip variation or a memory die variation), and accordingly, a duty mismatch may be generated again in a process in which a duty corrected signal is output through the output driver. Furthermore, duty cycle degradation may be generated in a process in which a signal output from the output driver is transmitted through a channel. Consequently, while a duty cycle of a duty corrected signal may be 50% in a DCC, due to memory die variation and channel variation, the duty cycle of a signal received from an input buffer of a controller may be degraded to about 45% to 55%.

However, in contrast to the comparative example, in an embodiment, the plurality of duty sensing circuits 200 of the chip 50 may perform a duty sensing operation on a signal received from an input buffer included in a controller, and duty cycle degradation due to the above-described memory die variation and channel variation may be corrected. In detail, each duty sensing circuit of the plurality of duty sensing circuits 200 may sense the duty cycle of an input signal and provide a comparison signal based on a sensing result to the plurality of DCCs 120. Accordingly, as each DCC of the plurality of DCCs 120 may perform a duty correction operation on the clock signal CLK based on the comparison signal, duty cycle degradation due to memory die variation and channel variation may be corrected. Accordingly, a duty cycle of an output signal of each DCC of the plurality of DCCs 120 might not be 50%, and a duty cycle of a signal received by the memory device 10 from the input buffer of the chip 50 (i.e., a signal input to the duty sensing circuits 200) may be corrected to be 50%.

In some embodiments, the storage device SD may be an internal memory included in an electronic device. For example, the storage device SD may include a solid-state drive (SSD), an embedded universal flash storage (UFS) memory device, or an embedded multi-media card (eMMC). In some embodiments, the storage device SD may be an external memory that is detachable from an electronic device. For example, the storage device SD may include a UFS memory card, a compact flash (CF), a secure digital (SD), a micro secure digital (micro-SD), a mini secure digital (mini-SD), an extreme digital (xD), or a Memory Stick.

Figure 2:
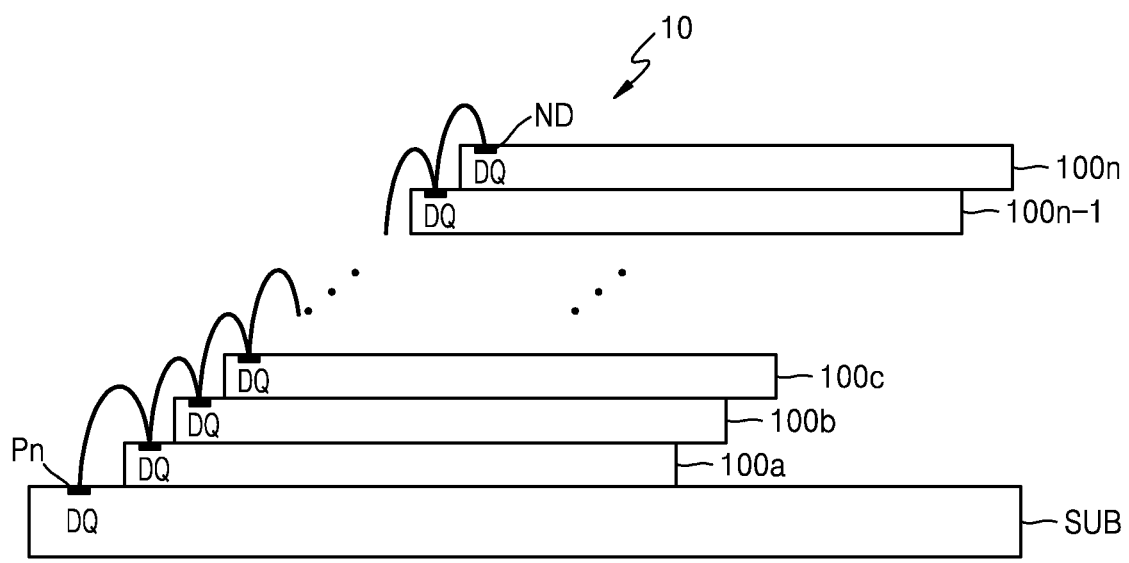
FIG. 2 is a diagram of the memory device of FIG. 1 according to an embodiment of the inventive concept.

FIG. 2 is a diagram of the memory device 10 of FIG. 1 according to an embodiment of the inventive concept.

Referring to FIG. 2, the memory device 10 may include a substrate SUB and first to $n^{th}$ memory chips 100a to 100n, where n is a positive integer. The first to $n^{th}$ memory chips 100a to 100n may be vertically stacked on the substrate SUB. A plurality of input/output pins Pn may be arranged on the substrate SUB, and input/output nodes ND of the first to $n^{th}$ memory chips 100a to 100n may be respectively connected to an input/output pin of the plurality of input/output pins Pn. For example, an input/output pin Pn and an input/output node ND may be connected to each other by wire bonding. In an embodiment in which the plurality of input/ output pins Pn and the input/output nodes ND are connected by wire bonding, the first to n$^{th}$ memory chips 100a to 100n may be stacked with a staircase skew in a horizontal direction, where a portion of an upper memory chip does not overlap a lower memory chip stacked beneath the upper memory chip.

Figure 3:
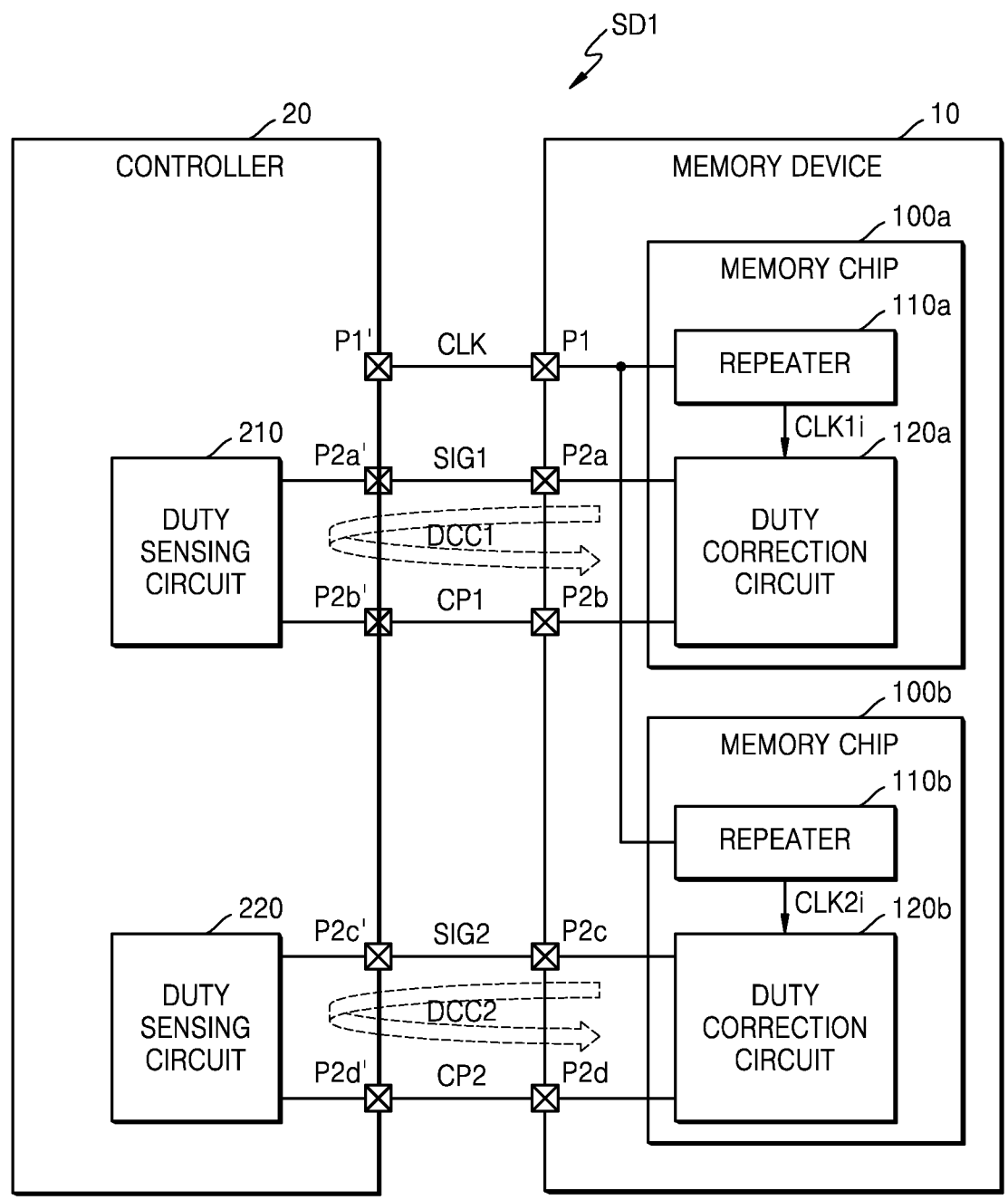
FIG. 3 is a block diagram of a storage device according to an embodiment of the inventive concept.

FIG. 3 is a block diagram of a storage device SD1 according to an embodiment of the inventive concept.

Referring to FIG. 3, the storage device SD1 may include the memory device 10 and the controller 20, and the memory device 10 may include first and second memory chips 100a and 100b. In an embodiment, the number of memory chips of the plurality of memory chips included in the memory device 10 may be alternatively or additionally be three or more. The memory device 10 may include a plurality of input/output pins that include the clock pin P1 and first to fourth pins P2a to P2d. The first and second memory chips 100a and 100b may be commonly connected to each of the clock pin P1 and the first to fourth pins P2a to P2d. The controller 20 may include a clock pin P1' and first to fourth pins P2a' to P2d', and the clock pin P1' and the first to fourth pins P2a' to P2d' may be respectively connected to the clock pin P1 and the first to fourth pins P2a to P2d of the memory device 10. The controller 20 may correspond to a memory controller. For example, the memory device 10 and the controller 20 may implement and/or follow a standard protocol such as Toggle or ONFI.

The first memory chip 100a may include a first repeater 110a and a first DCC 120a, and the second memory chip 100b may include a second repeater 110b and a second DCC 120b. The controller 20 may include a plurality of duty sensing circuits that include a first duty sensing circuit 210 corresponding to the first memory chip 100a and a second duty sensing circuit 220 corresponding to the second memory chip 100b. For example, in the DCC training period, the first and second pins P2a and P2b may be assigned to the first memory chip 100a, and the third and fourth pins P2c and P2d may be assigned to the second memory chip 100b. Accordingly, in the DCC training period, in the first memory chip 100a, the input buffer and the output driver respectively connected to the third and fourth pins P2c and P2d may be disabled, and in the second memory chip 100b, the input buffer and the output driver respectively connected to the first and second pins P2a and P2b may be disabled.

The first DCC 120a may be connected to the first and second pins P2a and P2b, the first duty sensing circuit 210 may be connected to the first and second pins P2a' and P2b', and the first DCC 120a and the first duty sensing circuit 210 may form a first DCC loop DCC1. Accordingly, the first duty sensing circuit 210 may sense the duty cycle of a first signal received from the first memory chip 100a and generate a first comparison signal, and the first DCC 120a may perform a first duty correction operation on a clock signal CLK based on the first comparison signal and generate a first correction clock signal.

Furthermore, the second DCC 120b may be connected to the third and fourth pins P2c and P2d, the second duty sensing circuit 220 may be connected to the third and fourth pins P2c' and P2d', and the second DCC 120b and the second duty sensing circuit 220 may form a second DCC loop DCC2. Accordingly, the second duty sensing circuit 220 may sense the duty cycle of a second signal received from the second memory chip 100b and generate a second comparison signal, and the second DCC 120b may perform a second duty correction operation on the clock signal CLK based on the second comparison signal and generate a second correction clock signal.

Figure 4:
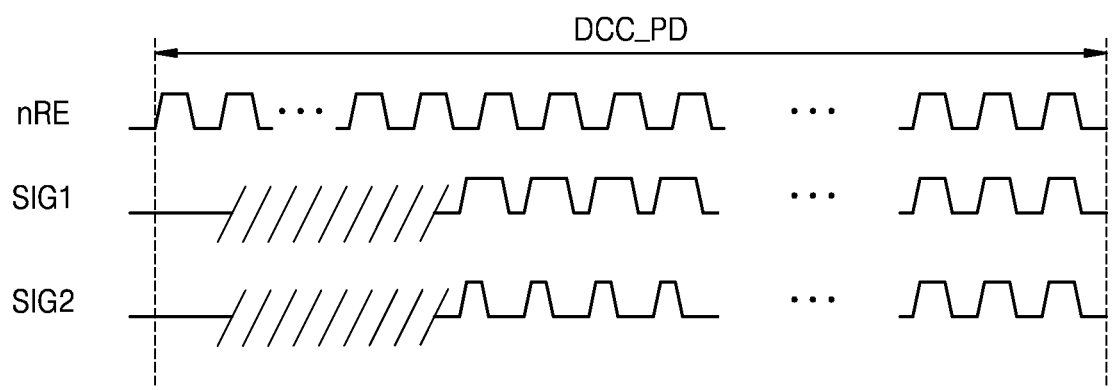
FIG. 4 is a timing diagram of signals according to a duty correction operation performed in the storage device of FIG. 3.

FIG. 4 is a timing diagram of signals according to the duty correction operation performed in the storage device SD1 of FIG. 3.

In a comparative example, a memory device included in an asynchronous system might not have a frequency that always toggles, and DCCs in the memory device may therefore perform a duty correction operation only in a period in which a clock signal is applied. However, in contrast to the comparative example, in an embodiment shown by FIGS. 3 and 4, the memory device 10 may perform a duty correction operation by using a read enable signal nRE as a clock signal CLK. In an embodiment, the first and second DCCs 120a and 120b may perform a duty correction operation in a DCC training period DCC_PD.

In the DCC training period DCC_PD, the first memory chip 100a may provide a first signal SIG1 to the first pin P2a, and the second memory chip 100b may provide a second signal SIG2 to the third pin P2c. The duty cycle of each of the first and second signals SIG1 and SIG2 might not be 50%.

The first duty sensing circuit 210 may sense the duty cycle of the first signal SIG1 and generate a first comparison signal, and the first DCC 120a may perform a duty correction operation on the read enable signal nRE based on the first comparison signal and correct the duty cycle of the first signal SIG1 close to 50%. Likewise, the second duty sensing circuit 220 may sense the duty cycle of the second signal SIG2 and generate a second comparison signal, and the second DCC 120b may perform a duty correction operation on the read enable signal nRE based on the second comparison signal and correct the second signal SIG2 close to 50%.

Figure 5:
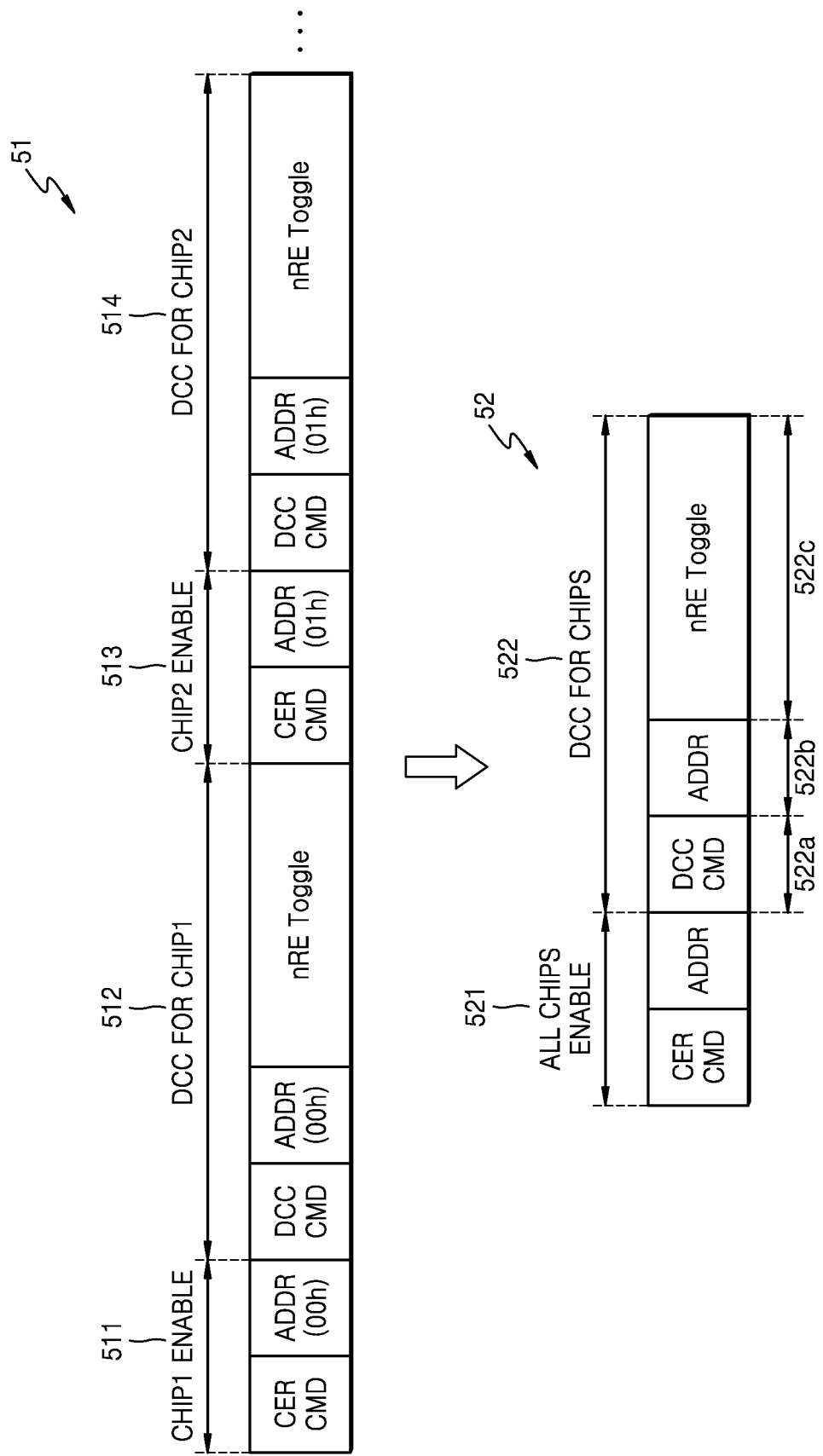
FIG. 5 is a timing diagram of a duty correction sequence according to a comparative example and a duty correction sequence according to an embodiment of the inventive concept.

FIG. 5 is a timing diagram of a duty correction sequence 51 according to a comparative example and a duty correction sequence 52 according to an embodiment of the inventive concept.

Referring to FIGS. 3 and 5 together, according to a comparative example, a controller may sequentially and respectively perform DCC trainings on a plurality of memory chips. For example, the duty correction sequence 51 may include a first chip enable period 511 and a first DCC training period 512 for performing DCC training on a first memory chip. In the first chip enable period 511, a controller may transmit a chip enable command CER CMD and an address ADDR (for example, 00h) to a memory device.

In the first DCC training period 512, the controller may transmit a DCC training command DCC CMD and the address ADDR to the memory device, and then the controller may perform a duty correction operation on a signal received from the first memory chip during a toggle period of a preset read enable signal nRE. As the controller sequentially performs DCC operations on the plurality of memory chips, the duty correction sequence 51 may further include a second chip enable period 513 and a second DCC training period 514 for performing DCC training on a second memory chip. As such, a total DCC training period may be further increased based on the number of memory chips included in the memory device.

However, in contrast to the comparative example, according to an embodiment of the inventive concept, the first and second memory chips 100a and 100b included in the memory device 10 may perform DCC trainings in parallel. Accordingly, the duty correction sequence 52 may include a chip enable period 521 and a DCC training period 522 for performing DCC training on a plurality of memory chips that include the first and second memory chips 100a and 100b. In the chip enable period 521, the controller 20 may select the plurality of memory chips by transmitting the chip enable command CER CMD and the address ADDR (for example, 80h) to the memory device 10.

The DCC training period 522 may include a first period 522a, a second period 522b, and a third period 522c. In the first period 522a, the controller 20 may transmit the DCC training command DCC CMD to the memory device 10, and in the second period 522b, the controller 20 may transmit the address ADDR to the memory device 10. The third period 522c may correspond to a toggle period of the preset read enable signal nRE, and in the third period 522c, each memory chip of the plurality of memory chips and a corresponding duty sensing circuit of the plurality of duty sensing circuits may perform a duty correction operation on the read enable signal nRE. In detail, in the third period 522c, the first memory chip 100a and the first duty sensing circuit 210 may perform a first duty correction operation on the read enable signal nRE through the first DCC loop DCC1, and the second memory chip 100b and the second duty sensing circuit 220 may perform a second duty correction operation on the read enable signal nRE through the second DCC loop DCC2. Accordingly, the first and second duty correction operations may be substantially simultaneously performed.

Figure 6:
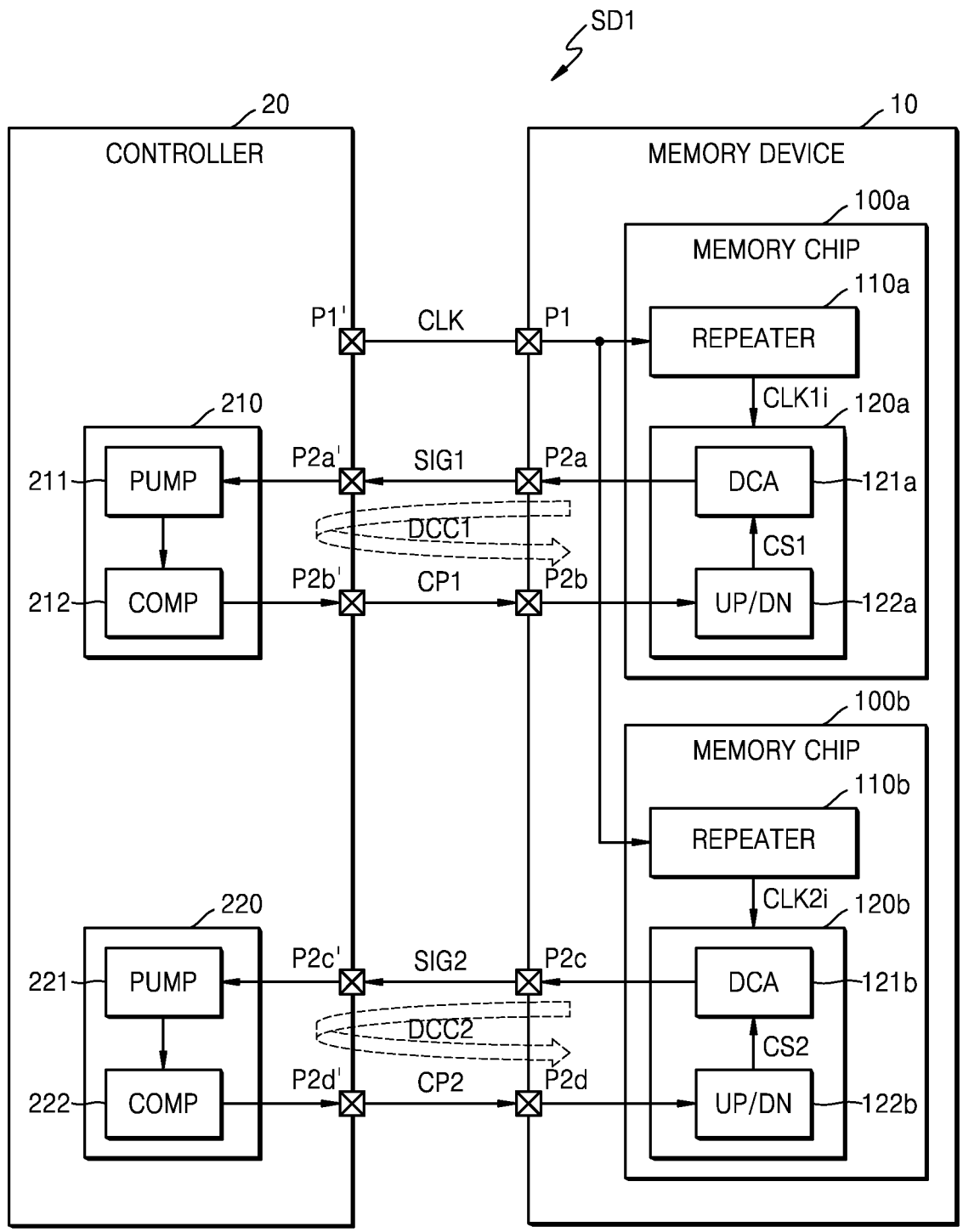
FIG. 6 is a detailed block diagram of the storage device of FIG. 3 according to an embodiment of the inventive concept.

FIG. 6 is a detailed block diagram of the storage device SD1 of FIG. 3 according to an embodiment of the inventive concept.

Referring to FIG. 6, the first memory chip 100a may include the first repeater 110a and the first DCC 120a, and the first DCC 120a may include a first duty cycle adjustment (DCA) circuit 121a and a first up/down counter 122a. The first duty sensing circuit 210 may include a first charge pump 211 and a first comparator 212. The first DCA circuit 121a, the first charge pump 211, the first comparator 212, and the first up/down counter 122a may form the first DCC loop DCC1 Likewise, the second memory chip 100b may include the second repeater 110b and the second DCC 120b, and the second DCC 120b may include a second DCA circuit 121b and a second up/down counter 122b. The second duty sensing circuit 220 may include a second charge pump 221 and a second comparator 222. The second DCA circuit 121b, the second charge pump 221, the second comparator 222, and the second up/down counter 122b may form the second DCC loop DCC2. Hereinafter, the operation of the first DCC loop DCC1 will be described in detail, and the description of the operation of the first DCC loop DCC1 may also describe an operation of the second DCC loop DCC2.

The first DCA circuit 121a may generate a first signal SIG1 based on a first internal clock signal CLK1i included in a clock signal CLK, and may output the first signal SIG1 through the first pin P2a. The first charge pump 211 may receive the first signal SIG1 through the first pin P2a', and may generate a pair of charge pump signals by performing a charge pumping operation based on the first signal SIG1. The first comparator 212 may generate a first comparison signal CP1 by comparing the pair of charge pump signals, and output the first comparison signal CP1 through the second pin P2b'. The first up/down counter 122a may receive the first comparison signal CP1 through the second pin P2b, and generate a first control signal CS1 based on the first comparison signal CP1. The first DCA circuit 121a may generate a first corrected signal having a corrected duty by adjusting the duty cycle of the first internal clock signal CLK1i based on the first control signal CS1, and may output the first corrected signal having a corrected duty.

In some embodiments, the first comparator 212 may be included in the first DCC 120a of the first memory chip 100a, and/or the second comparator 222 may be included in the second DCC 120b of the second memory chip 100b. In some embodiments, the first up/down counter 122a may be included in the first duty sensing circuit 210, and/or the second up/down counter 122b may be included in the second duty sensing circuit 220. As such, detailed configurations of the first and second duty sensing circuits 210 and 220 and/or the first and second DCCs 120a and 120b may be freely changed according to an embodiment.

Figure 7:
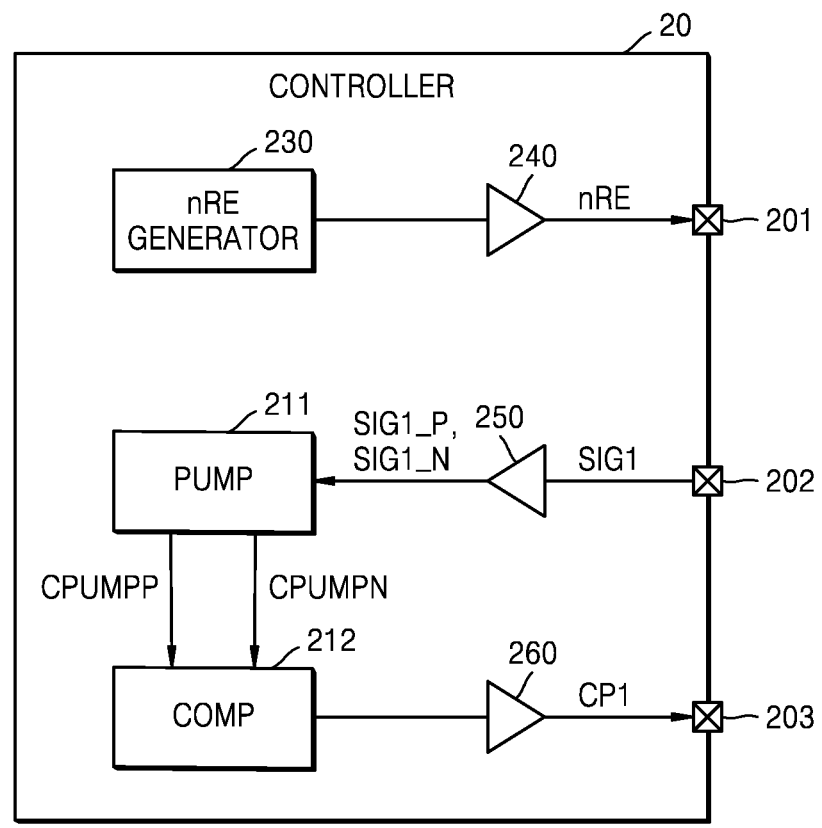
FIG. 7 is a block diagram of a controller according to an embodiment of the inventive concept.

FIG. 7 is a block diagram of the controller 20 according to an embodiment of the inventive concept.

Referring to FIG. 7, the controller 20 may include the first charge pump 211, the first comparator 212, a read enable signal generator 230, first and second output drivers 240 and 260, an input buffer 250, and first to third pads 201, 202, and 203. The first pad 201 may correspond to the clock pin P1' of FIG. 6, and the second and third pads 202 and 203 may respectively correspond to the first and second pins P2a' and P2b' of FIG. 6. The read enable signal generator 230 may generate the read enable signal nRE in the DCC training period 522 (refer to FIG. 5), and the read enable signal nRE may be provided to the first pad 201 through the first output driver 240.

The input buffer 250 may receive the first signal SIG1 through the second pad 202, and a first positive signal SIG1_P and a first negative signal SIG1_N may be output from the input buffer 250 in response. The first positive signal SIG1_P and the first negative signal SIG1_N may have a duty cycle based on the first signal SIG1, the first positive signal SIG1_P may have a normal phase corresponding to the first signal SIG1, and the first negative signal SIG1_N may have a reverse phase to a phase of the first signal SIG1. However, embodiments of the inventive concept are not necessarily limited thereto, and in some embodiments, a repeater may be further provided between the input buffer 250 and the first charge pump 211. The repeater may receive the first signal SIG1 from the input buffer 250 and may output the first positive signal SIG1_P and the first negative signal SIG1_N. Furthermore, in some embodiments, the repeater may output the first signal SIG1 and a reference signal corresponding to the first signal SIG1.

The first charge pump 211 may generate first and second charge pump signals CPUMPP and CPUMPN respectively based on the first positive signal SIG1_P and the first negative signal SIG1_N. For example, an amplitude (e.g., a voltage) of the first charge pump signal CPUMPP may increase in a logic high period of the first positive signal SIG1_P, and may decrease in a logic low period of the first positive signal SIG1_P. Likewise, an amplitude (e.g., a voltage) of the second charge pump signal CPUMPN may increase in a logic high period of the first negative signal SIG1_N, and may decrease in a logic low period of the first negative signal SIG1_N. Accordingly, a duty mismatch may be generated in the first positive signal SIG1_P and the first negative signal SIG1_N, and thus a logic high period may be relatively long in the first positive signal SIG1_P and a logic high period may be relatively short in the first negative signal SIG1_N. After several clock cycles of the first positive signal SIG1_P and the first negative signal SIG1_N have elapsed, the amplitude of the first charge pump signal CPUMPP may increase, whereas the amplitude of the second charge pump signal CPUMPN may decrease.

The first comparator 212 may compare the first and second charge pump signals CPUMPP and CPUMPN, and may generate the first comparison signal CP1 based on the comparison. For example, when the amplitude of the first charge pump signal CPUMPP is greater than the amplitude of the second charge pump signal CPUMPN, the first comparator 212 may generate the first comparison signal CP1 to be logic high, and when the amplitude of the first charge pump signal CPUMPP is not greater than the amplitude of the second charge pump signal CPUMPN, the first comparator 212 may generate the first comparison signal CP1 to be logic low. The first comparison signal CP1, generated from the first comparator 212, may be output to the third pad 203 through the second output driver 260.

Figure 8:
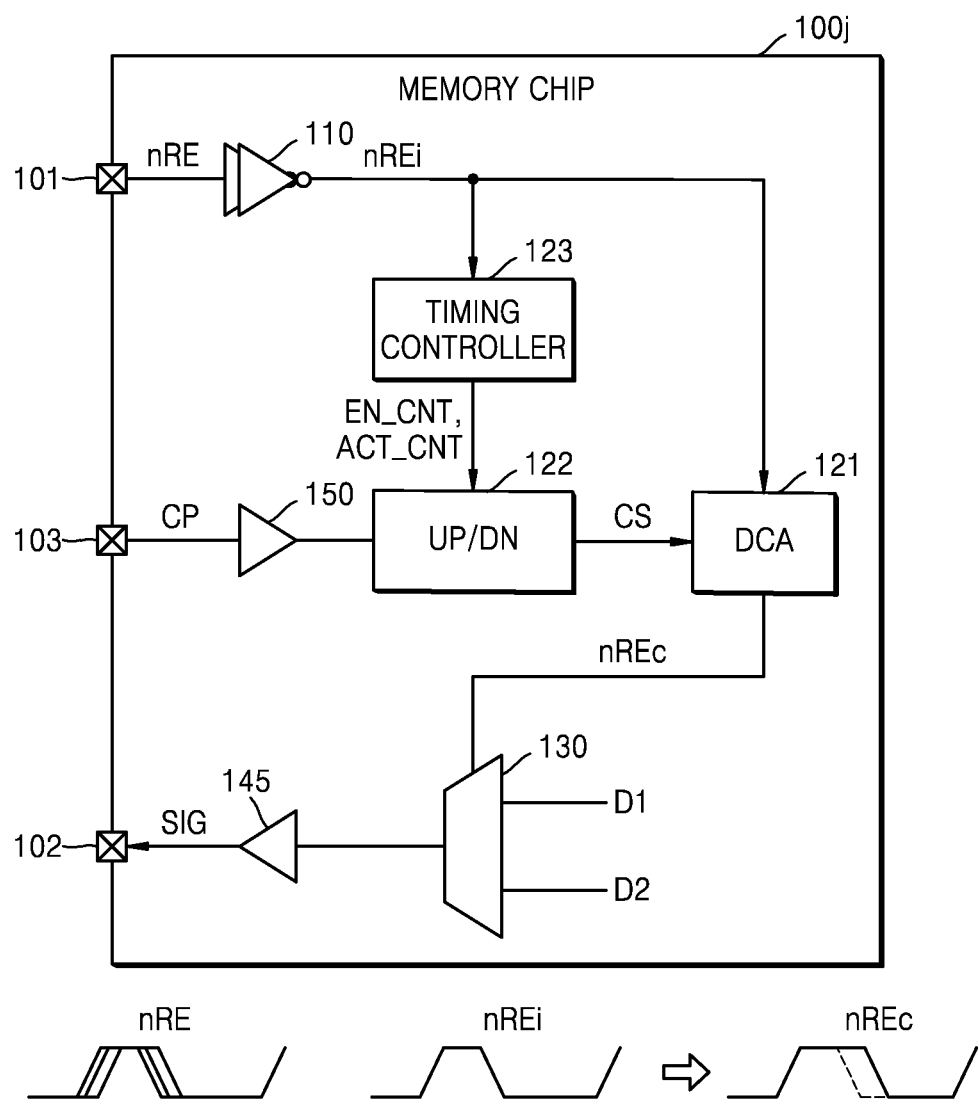
FIG. 8 is a block diagram of a memory chip according to an embodiment of the inventive concept.

FIG. 8 is a block diagram of a memory chip 100*j* according to an embodiment of the inventive concept.

Referring to FIG. 8, the memory chip 100*j* is a memory chip of the plurality of memory chips 100, and the first and second memory chips 100*a* or 100*b* of FIG. 6 may be implemented as the memory chip 100*j*. The memory chip 100*j* may include a repeater 110, a DCA circuit 121, an up/down counter 122, a timing controller 123, a multiplexer 130, an output driver 145, an input buffer 150, and first to third pads 101, 102, and 103. The first pad 101 may correspond to the clock pin P1 of FIG. 6, and the second and third pads 102 and 103 may correspond to the first and second pins P2*a* and P2*b* of FIG. 6.

The repeater 110 may receive the read enable signal nRE from the controller 20 through the first pad 101, and an internal read enable signal nREi may be generated from the received read enable signal nRE. When a duty mismatch is generated in the read enable signal nRE, a duty mismatch may be generated in the internal read enable signal nREi. When a duty mismatch is not generated in the read enable signal nRE, a duty mismatch may be generated in the internal read enable signal nREi while passing through the repeater 110.

The DCA circuit 121 may generate a corrected read enable signal nREc (that is, a corrected clock signal) in response to the internal read enable signal nREi. The multiplexer 130 may receive first and second internal data D1 and D2, and generate the first signal SIG1 based on the first and second internal data D1 and D2 and the corrected read enable signal nREc. The generated first signal SIG1 may be output to the second pad 102 through the output driver 145. The multiplexer 130 may output the first internal data D1 in a logic high period of the corrected read enable signal nREc, and may output the second internal data D2 in a logic low period of the corrected read enable signal nREc, thereby generating a signal SIG.

In an embodiment, the memory chip 100*j* may include a random data generator, and the first and second internal data D1 and D2 may be generated by the random data generator. In an embodiment, the memory chip 100*j* may include a register, and the first and second internal data D1 and D2 may be data that is stored in the register. For example, the first internal data D1 may be logic 1, and the second internal data D2 may be logic 0. In an embodiment, in the DCC training period 522 (refer to FIG. 5), the first internal data D1 may be fixed to logic 1 (e.g., a power voltage VDD) and the second internal data D2 may be fixed to logic 0 (e.g., a ground voltage GND).

The input buffer 150 may receive a comparison signal CP from the controller 20 through the third pad 103, and may provide the received comparison signal CP to the up/down counter 122. The up/down counter 122 may generate a control signal CS in response to the comparison signal CP. For example, the control signal CS may be generated as a 4-bit digital code. When the comparison signal CP is logic high, a value of the control signal CS may increase by 1, and when the comparison signal CP is logic low, the value of the control signal CS may decrease by 1.

The timing controller 123 may generate a plurality of timing control signals that are synchronized with the internal read enable signal nREi. For example, the timing controller 123 may enable the up/down counter 122 by generating and providing an enable signal EN_CNT to the up/down counter 122 Furthermore, for example, the timing controller 123 may activate a counting operation of the up/down counter 122 by generating an activation signal ACT_CNT and providing the activation signal ACT_CNT to the up/down counter 122, and the up/down counter 122 may generate the control signal CS in response to the activation signal ACT_CNT.

Figure 9:
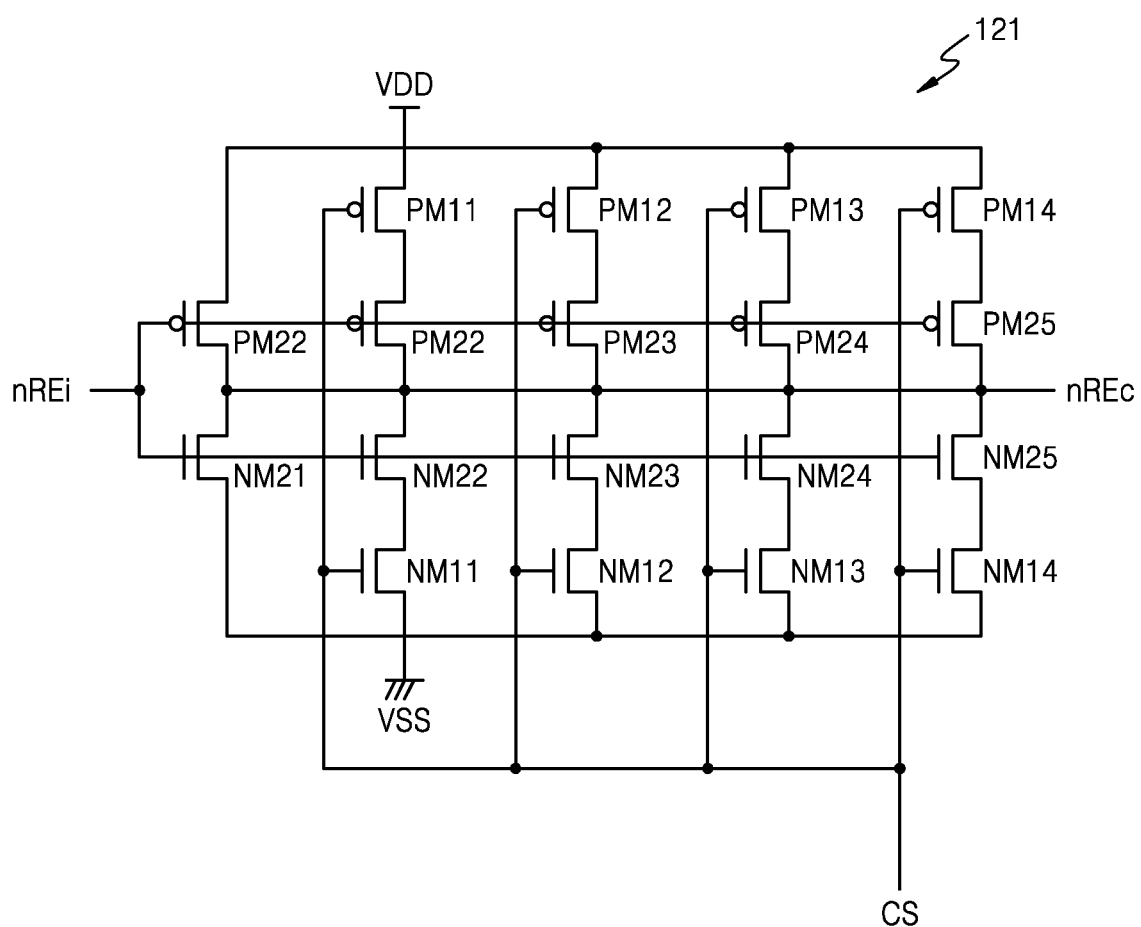
FIG. 9 is a circuit diagram of a duty cycle adjustment circuit according to an embodiment of the inventive concept.

FIG. 9 is a circuit diagram of the DCA circuit 121 according to an embodiment of the inventive concept.

Referring to FIG. 9, the DCA circuit 121 may include a first plurality of PMOS transistors PM11 to PM14, a second plurality of PMOS transistors PM21 to PM25, a first plurality of NMOS transistors NM11 to NM14, and a second plurality of NMOS transistors NM21 to NM25. The first plurality of PMOS transistors PM11 to PM14 may be commonly connected to a power voltage terminal VDD, the first plurality of NMOS transistors NM11 to NM14 may be commonly connected to a ground voltage terminal VSS, and the first plurality of PMOS transistors PM11 to PM14 and the first plurality of NMOS transistors NM11 to NM14 may be driven by the control signal CS. The second plurality of PMOS transistors PM21 to PM25 and the second plurality of NMOS transistors NM21 to NM25 may be driven by the internal read enable signal nREi.

For example, the control signal CS may be a 4-bit digital code. For example, when the value of the control signal CS increases by 1, some of the first plurality of PMOS transistors PM11 to PM14 may turn off, and some of the first plurality of NMOS transistors NM11 to NM14 may turn on. Accordingly, compared with the internal read signal nREi, a logic high period of an adjustment internal read signal nREc may be reduced. For example, when the value of the control signal CS decreases by 1, some of the first plurality of PMOS transistors PM11 to PM14 may turn on, and some of the first plurality of NMOS transistors NM11 to NM14 may turn off. Accordingly, compared with the internal read signal nREi, the logic high period of the adjustment internal read signal nREc may be increased.

Figure 10:
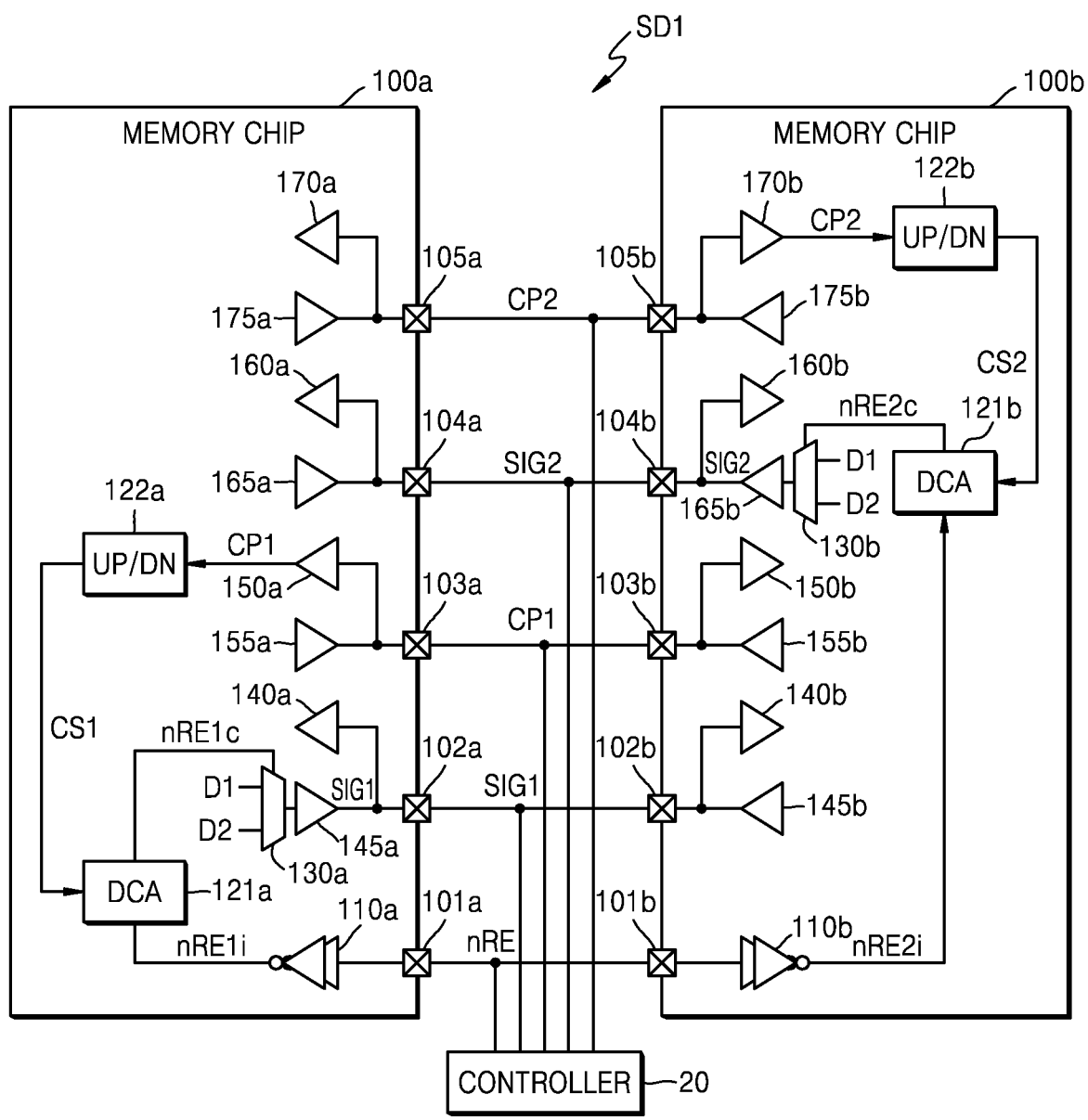
FIG. 10 is a detailed block diagram of the storage device of FIG. 6 according to an embodiment of the inventive concept.

FIG. 10 is a detailed block diagram of the storage device SD1 of FIG. 6 according to an embodiment of the inventive concept.

Referring to FIGS. 6 and 10 together, first to fifth pads 101*a* to 105*a* of the first memory chip 100*a* may be respectively connected to sixth to tenth pads 101*b* to 105*b* of the second memory chip 100*b*. For example, the first pads 101*a* and 101*b* may be commonly connected to the clock pin P1 and may receive the read enable signal nRE from the controller 20. For example, the second pads 102*a* and 102*b* may be commonly connected to the first pin P2*a*, the third pads 103*a* and 103*b* may be commonly connected to the second pin P2*b*, the fourth pads 104*a* and 104*b* may be commonly connected to the third pin P2*c*, and the fifth pads 105*a* and 105*b* may be commonly connected to the fourth pin P2*d*.

The first memory chip 100*a* may include the first repeater 110*a*, the first DCA circuit 121*a*, the first up/down counter 122*a*, a first multiplexer 130*a*, first to fourth input buffers 140*a*, 150*a*, 160*a*, and 170*a*, and first to fourth output drivers 145*a*, 155*a*, 165*a*, and 175*a*. Redundant descriptions of components already described with reference to FIGS. 8 and 9 will be omitted. The first input buffer 140a and the first output driver 145a may be connected to the second pad 102a, the second input buffer 150a and the second output driver 155a may be connected to the third pad 103a, the third input buffer 160a and the third output driver 165a may be connected to the fourth pad 104a, and the fourth input buffer 170a and the fourth output driver 175a may be connected to the fifth pad 105a. Similarly to the first output driver 145a, each of the second to fourth output drivers 155a, 165a, and 175a may be connected to a corresponding multiplexer, and each of the second to fourth output drivers 155a, 165a, and 175a may respectively output the output signals of the corresponding multiplexer to the third, fourth, and fifth pads 103a, 104a, and 105a.

For example, the first to fourth input buffers 140a, 150a, 160a, and 170a and the first to fourth output drivers 145a, 155a, 165a, and 175a included in the first memory chip 100a may be set in the chip enable period 521 and the first period 522a of the DCC training period 522 of the duty correction sequence 52 of FIG. 5. For example, the first, third, and fourth input buffers 140a, 160a, and 170a and the second to fourth output drivers 155a, 165a, and 175a may be disabled, and the second input buffer 150a and the first output driver 145a may be enabled.

The first repeater 110a may generate a first internal read enable signal nRE1i based on the read enable signal nRE, and may provide the first internal read enable signal nRE1i to the first DCA circuit 121a. The first DCA circuit 121a may generate a first corrected read enable signal nRE1c based on the first internal read enable signal nRE1i and may provide the first corrected read enable signal nRR1c to the first multiplexer 130a as a first selection signal. The first up/down counter 122a may generate the first control signal CS1 based on the first comparison signal CP1, and provide the first control signal CS1 to the first DCA circuit 121a.

The first DCA circuit 121a may generate the first corrected read enable signal nRE1c by performing a first duty correction operation on the first internal read enable signal nRE1i based on the first control signal CS1, and may provide the generated first corrected read enable signal nRE1c to the first multiplexer 130a as the first selection signal. The first multiplexer 130a may generate the first signal SIG1 based on the first corrected read enable signal nRE1c, and may output the first signal SIG1 to the second pad 102a of the first memory chip 100a through the output driver 145a. In an embodiment, when the first duty correction operation on the first internal read enable signal nRE1i is completed, the first memory chip 100a may output the first signal SIG1 to the second pad 102a of the first memory chip 100a.

The second memory chip 100b may include the second repeater 110b, the second DCA circuit 121b, the second up/down counter 122b, a second multiplexer 130b, fifth to eighth input buffers 140b, 150b, 160b, and 170b, and fifth to eighth output drivers 145b, 155b, 165b, and 175b. Redundant descriptions of components already described with reference to FIGS. 8 and 9 will be omitted. The fifth input buffer 140b and the fifth output driver 145b may be connected to the second pad 102b, the sixth input buffer 150b and the sixth output driver 155b may be connected to the third pad 103b, the seventh input buffer 160b and the seventh output driver 165b may be connected to the fourth pad 104b, and the eighth input buffer 170b and the eighth output driver 175b may be connected to the fifth pad 105b. Similarly to the seventh output driver 165b, each of the fifth, sixth, and eighth output drivers 145b, 155b, and 175b may be connected to a corresponding multiplexer, and each of the fifth, sixth, and eighth output drivers 145b, 155b, and 175b may respectively output the output signals of the corresponding multiplexer to the second, third, and fifth pads 102b, 103b, and 105b of the second memory chip 100b.

For example, the fifth to eighth input buffers 140b, 150b, 160b, and 170b and the fifth to eighth output drivers 145b, 155b, 165b, and 175b included in the second memory chip 100b may be set in the chip enable period 521 and the first period 522a of the DCC training period 522 of the duty correction sequence 52 of FIG. 5. For example, the fifth to seventh input buffers 140b, 150b, and 160b and the fifth, sixth, and eighth output drivers 145b, 155b, and 175b may be disabled, and the eighth input buffer 170b and the seventh output driver 165b may be enabled.

The second repeater 110b may generate a second internal read enable signal nRE2i based on the read enable signal nRE, and may provide the second internal read enable signal nRE2i to the second DCA circuit 121b. The second DCA circuit 121b may generate a second corrected read enable signal nRE2c based on the second internal read enable signal nRE2i and may provide the second corrected read enable signal nRE2x to the second multiplexer 130b as a second selection signal. The second up/down counter 122b may generate a second control signal CS2 based on a second comparison signal CP2, and may provide the second control signal CS2 to the second DCA circuit 121b.

The second DCA circuit 121b may generate the second corrected read enable signal nRE2c by performing a second duty correction operation on the second internal read enable signal nRE2i based on the second control signal CS2, and may provide the generated second corrected read enable signal nRE2c to the second multiplexer 130b as the second selection signal. The second multiplexer 130b may generate a second signal SIG2 based on the second corrected read enable signal nRE2c, and may output the generated second signal SIG2 to the fourth pad 104b of the second memory chip 100b through the seventh output driver 165b. In an embodiment, when the second duty correction operation on the second internal read enable signal nRE2i is completed, the second memory chip 100b may output the second signal SIG2 to the fourth pad 104b of the second memory chip 100b.

Figure 11:
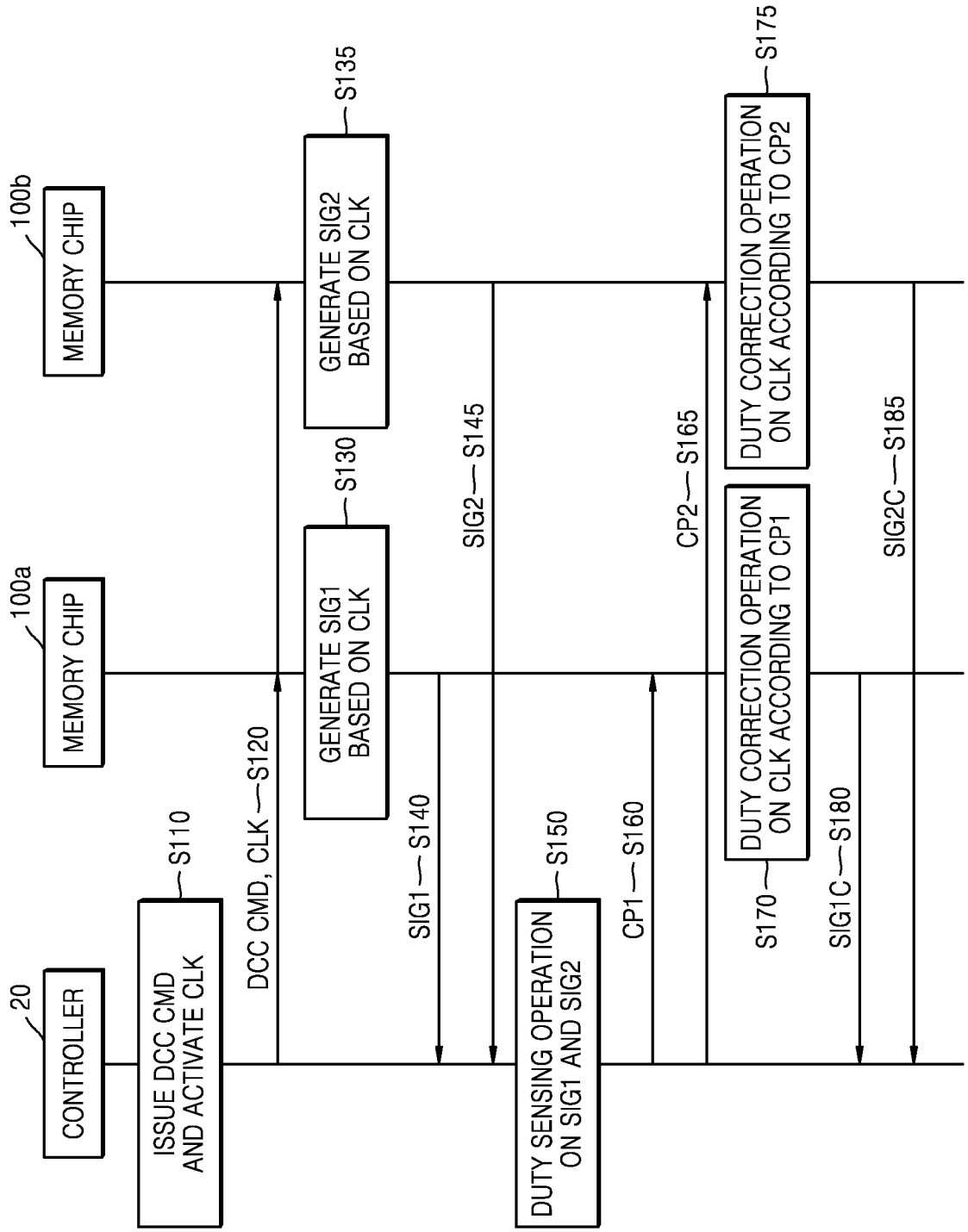
FIG. 11 is a flowchart of operations of a controller and first and second memory chips according to an embodiment of the inventive concept.

FIG. 11 is a flowchart of operations of the controller 20 and the first and second memory chips 100a and 100b, according to an embodiment of the inventive concept.

Referring to FIGS. 6 and 11 together, in operation S110, the controller 20 may issue a DCC command (DCC CMD) corresponding to an initiation of DCC training, and activate the clock signal CLK. For example, the DCC CMD may correspond to a set feature command or a DCC training command. For example, the clock signal CLK may include the read enable signal nRE. In operation S120, the controller 20 may transmit the DCC CMD and the clock signal CLK to the first and second memory chips 100a and 100b. For example, the DCC CMD may be transmitted from the controller 20 to the first and second memory chips 100a and 100b through the first to fourth pins P2a' to P2d', and the controller 20 may transmit the clock signal CLK to the first and second memory chips 100a and 100b through the clock pin P1'.

In operation S130, the first memory chip 100a may generate the first signal SIG1 based on the clock signal CLK. In operation S135, the second memory chip 100b may generate the second signal SIG2 based on the clock signal CLK. In an embodiment, operations S130 and S135 may be performed in parallel. In operation S140, the first memory chip 100a may transmit the first signal SIG1 to the controller 20 through the first pins P2a and P2a'. For example, the first pins P2a and P2a' may correspond to the input/output pins through which first data (i.e., the first signal SIG1) may be transmitted and/or received. In operation S145, the second memory chip 100b may transmit the second signal SIG2 to the controller 20 through the third pins P2c and P2c'. For example, the third pins P2c and P2c' may correspond to the input/output pins through which second data (i.e., the second signal SIG2) may be transmitted and/or received. In an embodiment, operations S140 and S145 may be performed in parallel.

In operation S150, the controller 20 may perform a duty sensing operation on the first signal SIG1 and the second signal SIG2. In the duty sensing operation, the first duty sensing circuit 210 may generate the first comparison signal CP1 based on the duty cycle of the first signal SIG1, and the second duty sensing circuit 220 may generate the second comparison signal CP2 based on the duty cycle of the second signal SIG2. In operation S160, the controller 20 may transmit the first comparison signal CP1 to the first memory chip 100a through the second pins P2b' and P2b. In operation S165, the controller 20 may transmit the second comparison signal CP2 to the second memory chip 100b through the fourth pins P2d' and P2d. In an embodiment, operations S160 and S165 may be performed in parallel.

In operation S170, the first memory chip 100a may perform a duty correction operation on the clock signal CLK based on the first comparison signal CP1. In operation S175, the second memory chip 100b may perform a duty correction operation on the clock signal CLK based on the second comparison signal CP2. In an embodiment, operations S170 and S175 may be performed in parallel. In operation S180, the first memory chip 100a may generate a first corrected signal SIG1C based on the duty correction operation and may transmit the first corrected signal SIG1C to the controller 20 through the first pins P2a and P2a'. For example, the first pins P2a and P2a' may correspond to the input/output pins through which first data (i.e., the first signal SIG1) may be transmitted and/or received. In operation S185, the second memory chip 100b may generate a second corrected signal SIG2C based on the duty correction operation and may transmit the second corrected signal SIG2C to the controller 20 through the third pins P2c and P2c'. For example, the third pins P2c and P2c' may correspond to the input/output pins through which second data (i.e., the second signal SIG2) is transmitted and/or received. In an embodiment, operations S180 and S185 may be performed in parallel.

Figure 12:
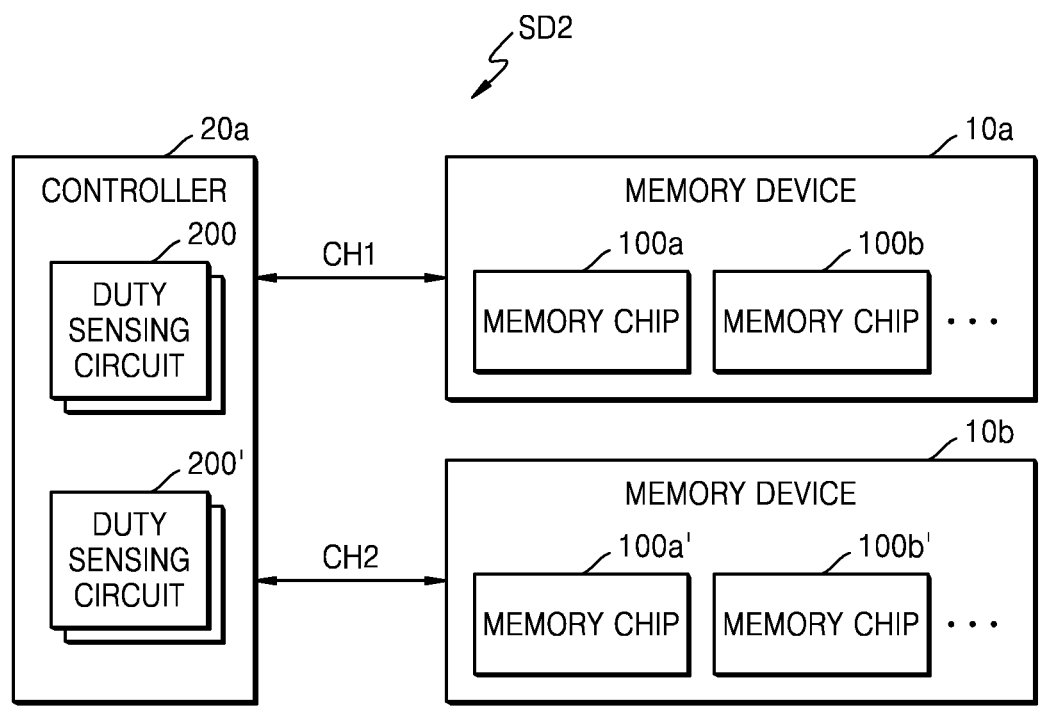
FIG. 12 is a schematic block diagram of a storage device according to an embodiment of the inventive concept.

FIG. 12 is a schematic block diagram of the storage device SD2 according to an embodiment of the inventive concept.

Referring to FIG. 12, the storage device SD2 may include first and second memory devices 10a and 10b and a controller 20a. The first memory device 10a may be connected to the controller 20a through a first channel CH1, and the second memory device 10b may be connected to the controller 20a through a second channel CH2. The first memory device 10a may include a first plurality of memory chips that include at least the first and second memory chips 100a and 100b. Accordingly, the first plurality of memory chips that include the first and second memory chips 100a and 100b may communicate signals and data with the controller 20a through the first channel CH1. The second memory device 10b may include a second plurality of memory chips that include at least the third and fourth memory chips 100a' and 100b'. Accordingly, the second plurality of memory chips that include the third and fourth memory chips 100a' and 100b' may communicate signals and data with the controller 20a through the second channel CH2.

The controller 20a may include a first plurality of duty sensing circuits 200 respectively corresponding to the first plurality of memory chips included in the first memory device 10a, and a second plurality of duty sensing circuits 200' respectively corresponding to the second plurality of memory chips included in the second memory device 10b. The first plurality of duty sensing circuits 200 and the first plurality of memory chips included in the first memory device 10a may form a first plurality of DCC loops, and the second plurality of duty sensing circuits 200' and the second plurality of memory chips included in the second memory device 10b may form a second plurality of DCC loops.

The descriptions of components and operations made with reference to FIGS. 1 to 11 may also be applied to similar components and operations of FIG. 12, and redundant descriptions will be omitted. Accordingly, each duty sensing circuit of the first and second pluralities of duty sensing circuits 200 and 200' may sense the duty cycle of a signal received from a corresponding memory chip, and may generate a comparison signal based on the sensed duty cycle. Each of the memory chips included in the first and second memory devices 10a and 10b may perform a duty correction operation on a clock signal based on a corresponding comparison signal, thereby generating a duty corrected signal, and may provide the duty corrected signal to the controller 20a through the first or second channels CH1 or CH2, respectively.

Figure 13:
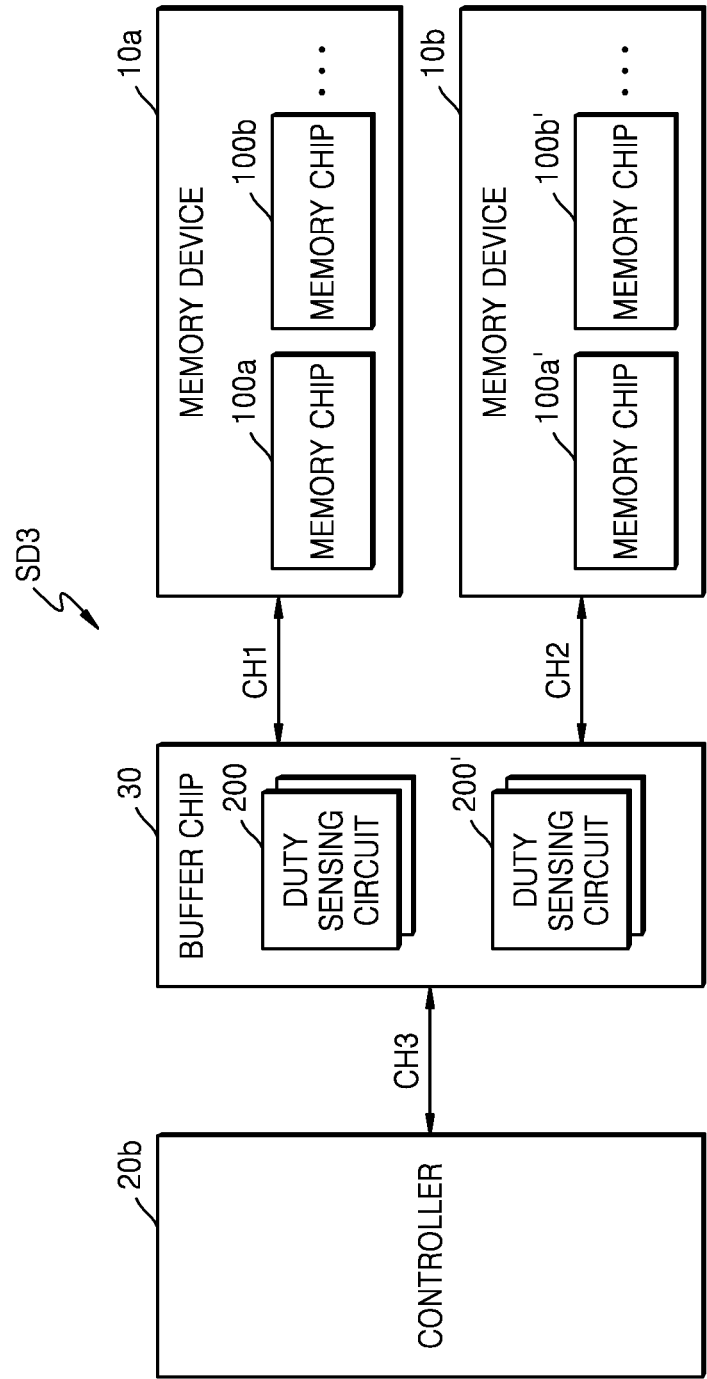
FIG. 13 is a schematic block diagram of a storage device according to an embodiment of the inventive concept.

FIG. 13 is a schematic block diagram of a storage device SD3 according to an embodiment of the inventive concept.

Referring to FIG. 13, the storage device SD3 may include the first and second memory devices 10a and 10b, a buffer chip 30, and a controller 20b. In an embodiment, the storage device SD3 may include the buffer chip 30, as compared with the storage device SD2 of FIG. 12. The buffer chip 30 may be connected between the controller 20b and the first and second memory devices 10a and 10b, and may be referred to as a frequency boosting interface (FBI) circuit. In an embodiment, the first and second memory devices 10a and 10b and the buffer chip 30 may be implemented in a single package, and may be referred to as a memory device or a non-volatile memory device.

The first memory device 10a may be connected to the buffer chip 30 through the first channel CH1, the second memory device 10b may be connected to the buffer chip 30 through the second channel CH2, and the buffer chip 30 may be connected to the controller 20b through a third channel CH3. The first memory device 10a may include a first plurality of memory chips that include at least the first and second memory chips 100a and 100b. Accordingly, the first plurality of memory chips that include the first and second memory chips 100a and 100b may communicate signals and data with the buffer chip 30 through the first channel CH1. The second memory device 10b may include a second plurality of memory chips that include the third and fourth memory chips 100a' and 100b'. Accordingly, the second plurality of memory chips that include the third and fourth memory chips 100a' and 100b' may communicate signals and data with respect to the buffer chip 30 through the second channel CH2.

The buffer chip 30 may include the first plurality of duty sensing circuits 200 respectively corresponding to the first plurality of memory chips included in the first memory device 10a and the second plurality of duty sensing circuits 200' respectively corresponding to the second plurality of memory chips included in the second memory device 10b.

The first plurality of duty sensing circuits 200 and the first plurality of memory chips included in the first memory device 10a may form a first plurality of DCC loops, and the second plurality of the duty sensing circuits 200' and the second plurality of memory chips included in the second memory device 10b may form a second plurality of DCC loops.

The descriptions of components and operations made with reference to FIGS. 1 to 11 may also be applied to similar components and operations of FIG. 13, and redundant descriptions will be omitted. Accordingly, each duty sensing circuit of the first and second plurality of duty sensing circuits 200 and 200' may sense the duty cycle of a received signal in the corresponding memory chip, and may generate a comparison signal based on the sensed duty cycle. Each of the memory chips included in the first and second memory devices 10a and 10b may generate a duty corrected signal by performing a duty correction operation on a clock signal based on the corresponding comparison signal, and may provide a duty corrected signal to the buffer chip 30 through the first or second channels CH1 or CH2, respectively.

Figure 14:
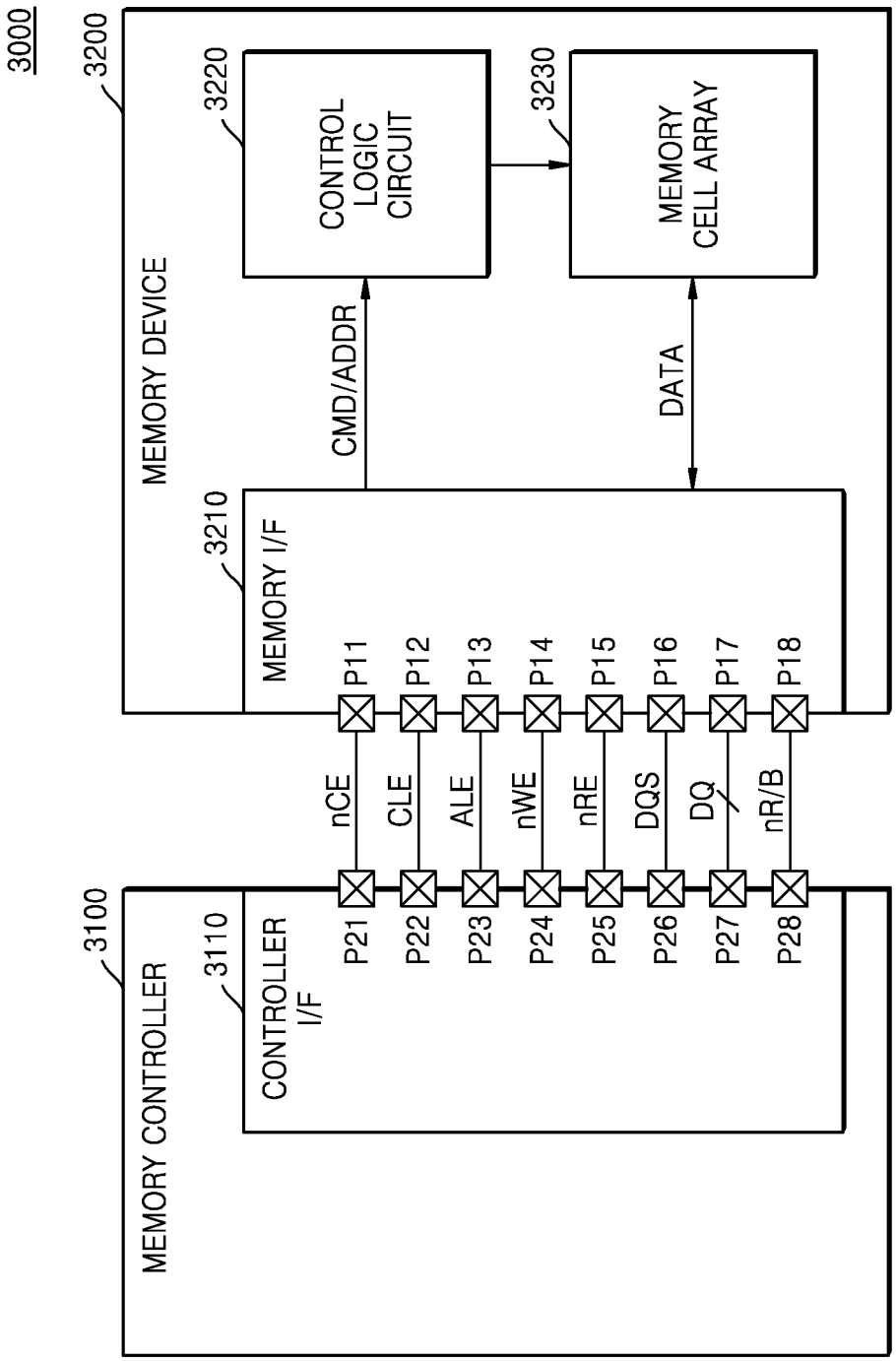
FIG. 14 is a block diagram of a memory system according to an embodiment of the inventive concept.

FIG. 14 is a block diagram of a memory system 3000 according to an embodiment of the inventive concept.

Referring to FIG. 14, the memory system 3000 may include a memory device 3200 and a memory controller 3100. The memory device 3200 may be implemented as a non-volatile memory (NVM) device. The memory device 3200 may communicate with the memory controller 3100 based on a channel of a plurality of channels. For example, the memory device 3200 may correspond to the memory device 10 in FIG. 3, and the memory controller 3100 may correspond to the controller 20 in FIG. 3.

The memory device 3200 may include first through eighth pins P11 through P18, a memory interface circuit 3210, a control logic circuit 3220, and a memory cell array 3230. The memory interface circuit 3210 may receive a chip enable signal nCE from the memory controller 3100 through the first pin P11. The memory interface circuit 3210 may exchange signals with the memory controller 3100 through the second through eighth pins P12 through P18 based on the chip enable signal nCE. For example, when the chip enable signal nCE is enabled (e.g., at a low level), the memory interface circuit 3210 may exchange signals with the memory controller 3100 through the second through eighth pins P12 through P18.

The memory interface circuit 3210 may receive a command latch enable signal CLE, an address latch enable signal ALE, and a write enable signal nWE from the memory controller 3100 through the second through fourth pins P12 through P14, respectively. The memory interface circuit 3210 may receive or transmit a data signal DQ from or to the memory controller 3100 through the seventh pin P17. The data signal DQ may include the command CMD, an address ADDR, and data DATA. For example, the data signal DQ may be transmitted through a plurality of data signal lines. In this case, the seventh pin P17 may include a plurality of pins respectively corresponding to the data signal lines.

The memory interface circuit 3210 may receive the command CMD included in the data signal DQ in an enable period (e.g., a high-level state) of the command latch enable signal CLE based on toggle timings of the write enable signal nWE. The memory interface circuit 3210 may acquire the address ADDR included in the data signal DQ in an enable period (e.g., a high-level state) of the address latch enable signal ALE based on the toggle timings of the write enable signal nWE.

In an embodiment, the write enable signal nWE may remain in a static state (e.g., a high level or a low level) or may toggle between the high level and the low level. For example, the write enable signal nWE may toggle in a period in which the command CMD or the address ADDR is transmitted. Accordingly, the memory interface circuit 3210 may acquire the command CMD or the address ADDR based on toggle timings of the write enable signal nWE.

The memory interface circuit 3210 may receive a read enable signal nRE from the memory controller 3100 through the fifth pin P15. The memory interface circuit 3210 may receive or transmit a data strobe signal DQS from or to the memory controller 3100 through the sixth pin P16.

In a data output operation of the memory device 3200, the memory interface circuit 3210 may receive the read enable signal nRE, which toggles, through the fifth pin P15 before outputting the data DATA. The memory interface circuit 3210 may generate the data strobe signal DQS, which toggles, based on toggling of the read enable signal nRE. For example, the memory interface circuit 3210 may generate the data strobe signal DQS, which may begin toggling following a certain delay after a toggling start time of the read enable signal nRE. The memory interface circuit 3210 may transmit the data signal DQ that includes the data DATA based on toggle timings of the data strobe signal DQS. Accordingly, the data DATA may be transmitted to the memory controller 3100 in synchronization with the toggle timings of the data strobe signal DQS.

In a data input operation of the memory device 3200, when the memory device 3200 receives the data signal DQ that includes the data DATA from the memory controller 3100, the memory interface circuit 3210 may receive the data strobe signal DQS, which toggles, from the memory controller 3100 together with the data DATA. The memory interface circuit 3210 may acquire the data DATA from the data signal DQ based on the toggle timings of the data strobe signal DQS. For example, the memory interface circuit 3210 may acquire the data DATA by sampling the data signal DQ at rising and falling edges of the data strobe signal DQS.

The memory interface circuit 3210 may transmit a ready/busy output signal nR/B to the memory controller 3100 through the eighth pin P18. The memory interface circuit 3210 may transmit state information of the memory device 3200 to the memory controller 3100 through the ready/busy output signal nR/B. When the memory device 3200 is in a busy state (that is, when internal operations of the memory device 3200 are being performed), the memory interface circuit 3210 may transmit the ready/busy output signal nR/B indicating the busy state (e.g., the ready/busy output signal nR/B having a low level) to the memory controller 3100. When the memory device 3200 is in a ready state (that is, when internal operations of the memory device 3200 are not performed or are completed), the memory interface circuit 3210 may transmit the ready/busy output signal nR/B indicating the ready state (e.g., the ready/busy output signal nR/B having a high level) to the memory controller 3100. For example, while the memory device 3200 is reading the data DATA from the memory cell array 3230 in response to a read command, the memory interface circuit 3210 may transmit the ready/busy output signal nR/B indicating the busy state (e.g., by having a low level) to the memory controller 3100. For example, while the memory device 3200 is programming the data DATA to the memory cell array 3230 in response to a program command, the memory interface circuit 3210 may transmit the ready/busy output signal nR/B indicating the busy state to the memory controller 3100.

The control logic circuit 3220 may control various operations of the memory device 3200. The control logic circuit 3220 may receive the command CMD and/or the address ADDR from the memory interface circuit 3210. The control logic circuit 3220 may generate control signals for controlling other elements of the memory device 3200 based on the command CMD and/or the address ADDR. For example, the control logic circuit 3220 may generate various control signals for programming the data DATA to the memory cell array 3230 or reading the data DATA from the memory cell array 3230.

The memory cell array 3230 may store data DATA received from the memory interface circuit 3210 in response to commands output by the control logic circuit 3220. The memory cell array 3230 may output data DATA that has been stored in the memory cell array 3230 to the memory interface circuit 3210 in response to commands output by the control logic circuit 3220.

The memory cell array 3230 may include a plurality of memory cells. For example, the plurality of memory cells may include flash memory cells. However, embodiments of the inventive concept are not necessarily limited thereto. For example, the memory cells may include RRAM cells, ferroelectric RAM (FRAM) cells, PRAM cells, thyristor RAM (TRAM) cells, or MRAM cells. Hereinafter, embodiments of the inventive concept will be described wherein the plurality of memory cells include NAND flash memory cells.

The memory controller 3100 may include ninth through sixteenth pins P21 through P28 and a controller interface circuit 3110. The ninth through sixteenth pins P21 through P28 may respectively correspond to the first through eighth pins P11 through P18 of the memory device 3200. The controller interface circuit 3110 may transmit the chip enable signal nCE to the memory device 3200 through the ninth pin P21. The controller interface circuit 3110 may exchange signals with the memory device 3200 through the tenth through sixteenth pins P22 through P28 based on the chip enable signal nCE.

The controller interface circuit 3110 may transmit the command latch enable signal CLE, the address latch enable signal ALE, and the write enable signal nWE to the memory device 3200 through the tenth through eleventh pins P22 through P24, respectively. The controller interface circuit 3110 may transmit or receive the data signal DQ to or from the memory device 3200 through the fifteenth pin P27.

The controller interface circuit 3110 may transmit the data signal DQ, which includes the command CMD or the address ADDR, to the memory device 3200 together with the write enable signal nWE, which toggles. The controller interface circuit 3110 may transmit the data signal DQ that includes the command CMD to the memory device 3200 by transmitting the command latch enable signal CLE, which is in the enable state, and may transmit the data signal DQ that includes the address ADDR to the memory device 3200 by transmitting the address latch enable signal ALE, which is in the enable state.

The controller interface circuit 3110 may transmit the read enable signal nRE to the memory device 3200 through the thirteenth pin P25. The controller interface circuit 3110 may receive or transmit the data strobe signal DQS from or to the memory device 3200 through the fourteenth pin P26.

In a data output operation of the memory device 3200, the controller interface circuit 3110 may generate and transmit the read enable signal nRE, which toggles, to the memory device 3200. For example, before the output of the data DATA, the controller interface circuit 3110 may generate the read enable signal nRE, which is converted from a static state (e.g., a high level or a low level) into a toggling state. Accordingly, the memory device 3200 may generate the data strobe signal DQS, which toggles, based on the read enable signal nRE. The controller interface circuit 3110 may receive the data signal DQ that includes the data DATA and the data strobe signal DQS, which toggles, from the memory device 3200. The controller interface circuit 3110 may acquire the data DATA from the data signal DQ based on the toggle timings of the data strobe signal DQS.

In a data input operation of the memory device 3200, the controller interface circuit 3110 may generate the data strobe signal DQS, which toggles. For example, before transmitting the data DATA, the controller interface circuit 3110 may generate the data strobe signal DQS, which may be converted from a static state (e.g., a high level or a low level) into a toggling state. The controller interface circuit 3110 may transmit the data signal DQ that includes the data DATA to the memory device 3200 based on the toggle timings of the data strobe signal DQS.

The controller interface circuit 3110 may receive the ready/busy output signal nR/B from the memory device 3200 through the sixteenth pin P28. The controller interface circuit 3110 may determine state information of the memory device 3200 based on the ready/busy output signal nR/B.

Figure 15:
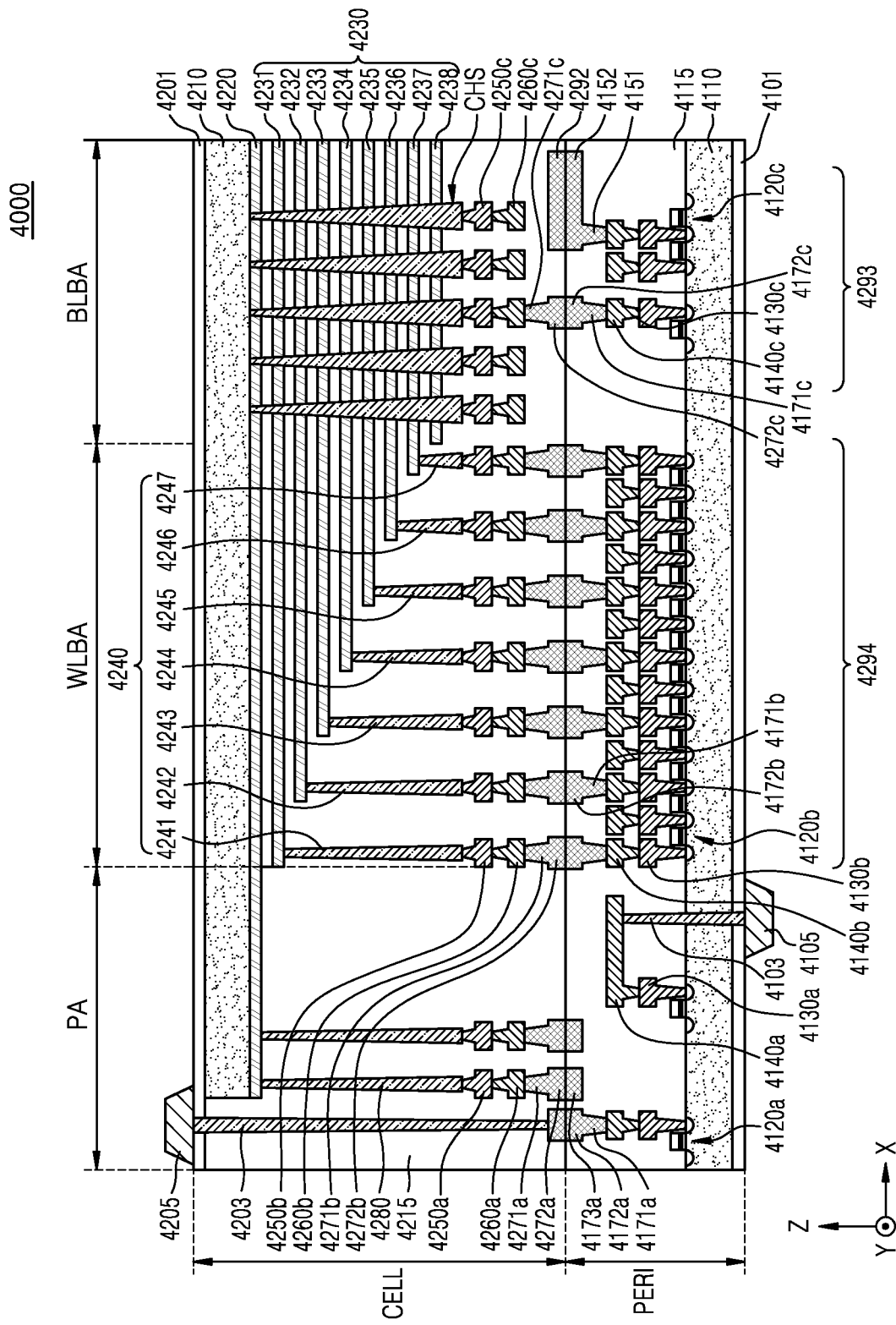
FIG. 15 is a cross-sectional view of a bonding VNAND (B-VNAND) structure that may be implemented in a memory device according to an embodiment of the inventive concept.

FIG. 15 is a cross-sectional view of a bonding VNAND (B-VNAND) structure that may be implemented in a memory device according to an embodiment of the inventive concept. In an embodiment, NVM included in a memory device may be implemented as B-VNAND type flash memory, and the NVM may have the structure illustrated in FIG. 15.

Referring to FIG. 15, a memory device 4000 may have a chip-to-chip (C2C) structure. In the C2C structure, an upper chip that includes a cell area CELL may be formed on a first wafer, a lower chip that includes a peripheral circuit area PERI may be formed on a second wafer that is different from the first wafer, and the upper chip may be connected to the lower chip by a bonding method. For example, the bonding method may include a method of electrically connecting a bonding metal formed in a topmost metal layer of the upper chip to a bonding metal formed in a topmost metal layer of the lower chip. For example, when the bonding metal includes copper (Cu), the bonding method may include a Cu—Cu bonding method. The bonding metal may include aluminum or tungsten.

Each of the peripheral circuit area PERI and the cell area CELL of the memory device 4000 may include an external pad bonding area PA, a word line bonding area WLBA, and a bit line bonding area BLBA.

The peripheral circuit area PERI may include a first substrate 4110, an interlayer insulating layer 4115, a plurality of circuit devices 4120a, 4120b, and 4120c formed in the first substrate 4110, a first plurality of metal layers 4130a, 4130b, and 4130c respectively connected to the plurality of circuit devices 4120a, 4120b, and 4120c, and a second plurality of metal layers 4140a, 4140b, and 4140c respectively formed on the first plurality of metal layers 4130a, 4130b, and 4130c. In an embodiment, the first plurality of metal layers 4130a, 4130b, and 4130c may include tungsten, as tungsten has a relatively higher resistance, and the second plurality of metal layers 4140a, 4140b, and 4140c may include copper, as copper has a relatively lower resistance.

In this specification, only the first plurality of metal layers 4130a, 4130b, and 4130c and the second plurality of metal layers 4140a, 4140b, and 4140c are illustrated and described, but embodiments of the inventive concept are not necessarily limited thereto. For example, at least one metal layer may be further formed on the second plurality of metal layers 4140a, 4140b, and 4140c. At least a portion of the at least one metal layer formed on the second plurality of metal layers 4140a, 4140b, and 4140c may include aluminum, which has a lower resistance than the copper included in the second plurality of metal layers 4140a, 4140b, and 4140c.

The interlayer insulating layer 4115 may be disposed on the first substrate 4110 and cover the plurality of circuit devices 4120a, 4120b, and 4120c, the first plurality of metal layers 4130a, 4130b, and 4130c, and the second plurality of metal layers 4140a, 4140b, and 4140c, and may include an insulating material such as silicon oxide or silicon nitride.

Lower bonding metals 4171b and 4172b may be formed on a fifth metal layer 4140b of the plurality of second metal layers 4140a, 4140b, and 4140c in the word line bonding area WLBA. In the word line bonding area WLBA, the lower bonding metals 4171b and 4172b of the peripheral circuit area PERI may be electrically connected to upper bonding metals 4271b and 4272b of the cell area CELL by a bonding method. The lower bonding metals 4171b and 4172b and the upper bonding metals 4271b and 4272b may include aluminum, copper, or tungsten.

The cell area CELL may include at least one memory block. The cell area CELL may include a second substrate 4210 and a common source line 4220. A plurality of word lines 4231 through 4238 (collectively denoted by 4230) may be stacked on the second substrate 4210 in a first direction (e.g., a Z-axis direction) perpendicular to a top surface of the second substrate 4210. A plurality of string selection lines may be arranged above the plurality of word lines 4230 and a ground selection line may be arranged below the plurality of word lines 4230. The plurality of word lines 4230 may be interposed with the plurality of string selection lines and the ground selection line.

In the bit line bonding area BLBA, a channel structure CHS may extend in the first direction perpendicular to the top surface of the second substrate 4210 and pass through the plurality of word lines 4230, the plurality of string selection lines, and the ground selection line. The channel structure CHS may include a data storage layer, a channel layer, and a buried insulating layer. The channel layer may be electrically connected to a first metal layer 4250c and a second metal layer 4260c. For example, the first metal layer 4250c may correspond to a bit line contact, and the second metal layer 4260c may correspond to a bit line and may be referred to hereinafter as a bit line 4260c. In an embodiment, the bit line 4260c may extend in a second direction (e.g., a Y-axis direction) parallel with the top surface of the second substrate 4210 and perpendicular to the first direction.

In an embodiment shown by FIG. 15, an area in which the channel structure CHS and the bit line 4260c are arranged may be defined as the bit line bonding area BLBA. The bit line 4260c may be electrically connected to a second plurality of circuit devices 4120c of the plurality of circuit devices 4120a, 4120b, and 4120c to constitute a page buffer 4293 in the peripheral circuit area PERI and in the bit line bonding area BLBA. For example, the bit line 4260c may be connected to upper bonding metals 4271c and 4272c in the bit line bonding area BLBA, and the upper bonding metals 4271c and 4272c may be connected to lower bonding metals 4171c and 4172c connected to the second plurality of circuit devices 4120c of the page buffer 4293.

In the word line bonding area WLBA, the plurality of word lines 4230 may extend in a third direction (e.g., an X-axis direction) parallel with the top surface of the second substrate 4210 and perpendicular to the first and second directions and may be connected to a plurality of cell contact plugs 4241 through 4247 (collectively denoted by 4240). The plurality of word lines 4230 may be connected to the plurality of cell contact plugs 4240 through a plurality of pads included in at least some word lines of the plurality of word lines 4230 extending in different lengths in the second direction. A first metal layer 4250b and a second metal layer 4260b may be sequentially stacked on each cell contact plug of the plurality of cell contact plugs 4240 connected to the plurality of word lines 4230. The plurality of cell contact plugs 4240 in the word line bonding area WLBA may be connected to the peripheral circuit area PERI through the upper bonding metals 4271b and 4272b of the cell area CELL and the lower bonding metals 4171b and 4172b of the peripheral circuit area PERI.

The plurality of cell contact plugs 4240 may be electrically connected to a third plurality of circuit devices 4120b of the plurality of circuit devices 4120a, 4120b, and 4120c to constitute a row decoder 4294 in the peripheral circuit area PERI. In an embodiment, operating voltages of the third plurality of circuit devices 4120b in the row decoder 4294 may be different from operating voltages of the second plurality of circuit devices 4120c in the page buffer 4293. For example, the operating voltages of the second plurality of circuit devices 4120c in the page buffer 4293 may be greater than the operating voltages of the third plurality of circuit devices 4120b in the row decoder 4294.

A common source line contact plug 4280 may be arranged in the external pad bonding area PA. The common source line contact plug 4280 may include a conductive material such as metal, a metal compound, or polysilicon, and may be electrically connected to the common source line 4220. A first metal layer 4250a and a second metal layer 4260a may be sequentially stacked on the common source line contact plug 4280. For example, an area in which the common source line contact plug 4280, the first metal layer 4250a, and the second metal layer 4260a are arranged may be referred to as the external pad bonding area PA.

First and second input/output pads 4105 and 4205 may be arranged in the external pad bonding area PA. Referring to FIG. 15, a lower insulating film 4101 covering a bottom surface of the first substrate 4110 may be formed below the first substrate 4110, and the first input/output pad 4105 may be formed on the lower insulating film 4101. The first input/output pad 4105 may be connected to at least one of the plurality of circuit devices 4120a, 4120b, and 4120c of the peripheral circuit area PERI through a first input/output contact plug 4103, and may be isolated from the first substrate 4110 by the lower insulating film 4101. A side insulating film may be disposed between the first input/output contact plug 4103 and the first substrate 4110 and may electrically isolate the first input/output contact plug 4103 from the first substrate 4110.

Referring to FIG. 15, an upper insulating film 4201 covering a top surface of the second substrate 4210 may be formed above the second substrate 4210, and the second input/output pad 4205 may be arranged on the upper insulating film 4201. The second input/output pad 4205 may be connected to at least one of the plurality of circuit devices 4120a, 4120b, and 4120c of the peripheral circuit area PERI through a second input/output contact plug 4203. For example, the second input-output contact plug 4203 may be connected to a circuit element 4120a of the plurality of circuit devices 4120a, 4120b, and 4120c through lower bonding metals 4171a and 4172a.

According to an embodiment, the second substrate 4210 and the common source line 4220 may be omitted from an area in which the second input/output contact plug 4203 is arranged. The second input/output pad 4205 might not overlap the word lines 4230 in the first direction (e.g., the Z-axis direction). Referring to FIG. 15, the second input/output contact plug 4203 may be separated from the second substrate 4210 in a direction parallel with the top surface of the second substrate 4210 and may pass through an interlayer insulating layer 4215 of the cell area CELL to connect to the second input/output pad 4205.

According to an embodiment, the first input/output pad 4105 and the second input/output pad 4205 may be selectively formed. For example, the memory device 400 may include only the first input/output pad 4105 on the first substrate 4110 or only the second input/output pad 4205 on the second substrate 4210. Alternatively, the memory device 4000 may include both the first input/output pad 4105 and the second input/output pad 4205.

A metal pattern of a topmost metal layer may be provided as a dummy pattern in the external pad bonding area PA of each of the cell area CELL and the peripheral circuit area PERI, or the topmost metal layer may omit the metal pattern.

Corresponding to an upper metal pattern 4272a in the topmost metal layer of the cell area CELL, a lower metal pattern 4173a having the same shape as upper metal pattern 4272a of the cell area CELL may be formed in a topmost metal layer of the peripheral circuit area PERI in the external pad bonding area PA. The lower metal pattern 4173a in the topmost metal layer of the peripheral circuit area PERI may not be connected to a contact in the peripheral circuit area PERI. Similarly, in correspondence to a lower metal pattern in the topmost metal layer of the peripheral circuit area PERI in the external pad bonding area PA, an upper metal pattern having the same shape as lower metal pattern of the peripheral circuit area PERI may be formed in the topmost metal layer of the cell area CELL.

The lower bonding metals 4171b and 4172b may be formed on the second metal layer 4140b in the word line bonding area WLBA. In the word line bonding area WLBA, the lower bonding metals 4171b and 4172b of the peripheral circuit area PERI may be electrically connected to the upper bonding metals 4271b and 4272b of the cell area CELL by a bonding method.

Corresponding to a lower metal pattern 4152 formed in the topmost metal layer of the peripheral circuit area PERI, an upper metal pattern 4292 having the same shape as the lower metal pattern 4152 of the peripheral circuit area PERI may be formed in the bit line bonding area BLBA on the topmost metal layer of the cell area CELL. A contact may be omitted on the upper metal pattern 4292 in the topmost metal layer of the cell area CELL. For example, the lower metal pattern 4152 may be connected to the circuit element 4120c through a lower bonding metal 4151.

A memory device, a memory controller, and a storage device according to some embodiments described with reference to FIGS. 1 to 15 may implement or follow a toggle protocol that may succeed Toggle DDR 4.0.

While the inventive concept has been particularly shown and described with reference to embodiments thereof, it will be understood that various changes in form and details may be made therein without departing from the spirit and scope of the present disclosure.

What is claimed is:

1. A storage device comprising:
a duty sensing chip configured to generate a clock signal, the duty sensing chip comprising a plurality of duty sensing circuits, each duty sensing circuit of the plurality of duty sensing circuits respectively configured to generate a positive signal and a negative signal based on a data signal of a plurality of data signals, the data signal having a duty cycle, the positive signal and the negative signal having the duty cycle of the data signal, the negative signal having a reverse phase to a phase of the positive signal, and to generate a comparison signal based on a comparison of the positive signal and the negative signal; and
a memory device including a plurality of memory chips respectively corresponding to the plurality of duty sensing circuits, each memory chip of the plurality of memory chips respectively configured to generate a data signal of the plurality of data signals, to generate an internal clock signal based on the clock signal, the internal clock signal having a duty cycle, and to correct the duty cycle of the internal clock signal based on the comparison signal.

2. The storage device of claim 1, wherein the duty sensing chip comprises a memory controller electrically connected to the plurality of memory chips through a plurality of input/output pins.

3. The storage device of claim 1, wherein;
the duty sensing chip comprises a buffer chip electrically connected between the plurality of memory chips and a memory controller.

4. The storage device of claim 1, wherein the clock signal is a read enable signal that toggles at a preset frequency during a training period.

5. The storage device of claim 1, wherein each memory chip of the plurality of memory chips respectively comprises:
an up/down counter configured to generate a control signal based on the comparison signal; and
a duty cycle adjustment circuit configured to correct the duty cycle of the internal clock signal based on the control signal.

6. The storage device of claim 1, wherein each memory chip of the plurality of memory chips further respectively comprises a multiplexer configured to generate the data signal based on first data, second data, and the internal clock signal, and to correct a duty cycle of the data signal based on the corrected duty cycle of the internal clock signal.

7. The storage device of claim 6, wherein a duty cycle of the clock signal and the corrected duty signal of the data signal are the same.

8. The storage device of claim 1, wherein each duty sensing circuit of the plurality of duty sensing circuits respectively comprises:
a charge pump configured to generate a first charge pump signal and a second charge pump signal based on the positive signal and the negative signal, respectively; and
a comparator configured to generate the comparison signal based on a comparison of the first charge pump signal and the second charge pump signal.

9. The storage device of claim 1, wherein the data signal is a toggle signal that toggles at a certain frequency.

10. The storage device of claim 1, wherein the plurality of memory chips generate the plurality of data signals in parallel with each other.

11. A memory device comprising:
a clock pin configured to receive a clock signal;
a plurality of input/output pins; and
a plurality of memory chips connected to the clock pin, each memory chip of the plurality of memory chips respectively comprising a repeater directly connected to the clock pin, the repeater configured to generate an internal clock signal based on the received clock signal, each memory chip of the plurality of memory chips respectively configured to correct a duty cycle of the internal clock signal during a training period and in parallel with each other based on a comparison signal respectively received by a corresponding input/output pin of the plurality of input/output pins, wherein the comparison signal is generated based on a comparison of a positive signal and a negative signal generated based on a data signal generated by each of the plurality of memory chips.

12. The memory device of claim 11, each memory chip of the plurality of memory chips further configured to generate a data signal, the memory device further comprising a buffer chip configured to:

provide the clock signal and the comparison signal.

13. The memory device of claim 12, wherein the buffer chip is further configured to generate the first comparison signal based on a duty cycle of the data signal.

14. The memory device of claim 11, wherein:

the clock signal and the comparison signal are received from a memory controller; and the plurality of input/output pins correspond to a first channel.

15. The memory device of claim 11, wherein each memory chip of the plurality of memory chips comprises:

an up/down counter configured to generate a control signal based on the comparison signal; and a duty cycle adjustment circuit configured to correct the duty cycle of the internal clock signal based on the control signal.

16. The memory device of claim 15, wherein each memory chip of the plurality of memory chips further comprises a multiplexer configured to generate the data signal based on first data, second data, and the internal clock signal, and to correct a duty cycle of the data signal based on the corrected duty cycle of the internal clock signal.

17. A memory controller comprising:

a clock pin configured to output a clock signal;

a plurality of input/output pins; and a plurality of duty sensing circuits respectively connected to the plurality of input/output pins and respectively corresponding to a plurality of memory chips, each duty sensing circuit of the plurality of duty sensing circuits respectively configured to generate a positive signal and a negative signal based on a data signal received in parallel with each other from a corresponding memory chip of the plurality of memory chips via a corresponding input/output pin of the plurality of input/output pins, the positive signal and the negative signal having the duty cycle of the data signal, the negative signal having a reverse phase to a phase of the positive signal, and to provide a comparison signal generated based on a comparison of the positive signal and the negative signal to the corresponding memory chip via another corresponding input/output pin of the plurality of input/output pins.

18. The memory controller of claim 17, wherein each duty sensing circuit of the plurality of duty sensing circuits respectively comprises:

a charge pump configured to generate a first charge pump signal and a second charge pump signal based on the positive signal and the negative signal, respectively; and a comparator configured to generate the comparison signal based on a comparison of the first charge pump signal and the second charge pump signal.

19. The memory controller of claim 17, wherein the clock signal is a read enable signal that toggles at a preset frequency during a training period.

* * * * *